(12) United States Patent
Hauf et al.

(10) Patent No.: US 9,116,440 B2
(45) Date of Patent: Aug. 25, 2015

(54) OPTICAL MODULE FOR GUIDING A RADIATION BEAM

(71) Applicant: Carl Zeiss SMT GmbH, Oberkochen (DE)

(72) Inventors: Markus Hauf, Ulm (DE); Severin Waldis, Aalen (DE); Wilfried Noell, Neuchatel (CH); Yves Petremend, Yverdon-les-Bains (CH); Marco Jassmann, Neresheim-Dorfmerkingen (DE); Lothar Kulzer, Adlersberg (DE); Caglar Ataman, Neuchatel (CH)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/243,515

(22) Filed: Apr. 2, 2014

(65) Prior Publication Data

US 2014/0211187 A1    Jul. 31, 2014

Related U.S. Application Data

(60) Division of application No. 13/075,929, filed on Mar. 30, 2011, now abandoned, which is a continuation of application No. PCT/EP2009/007476, filed on Oct. 19, 2009.

(60) Provisional application No. 61/153,705, filed on Feb. 19, 2009.

(30) Foreign Application Priority Data

Oct. 20, 2008   (DE) .......................... 10 2008 052 153
Feb. 19, 2009   (DE) .......................... 10 2009 009 568
Jul. 24, 2009   (DE) .......................... 10 2009 034 502

(51) Int. Cl.
*G02B 5/08*       (2006.01)
*G03B 27/42*      (2006.01)
(Continued)

(52) U.S. Cl.
CPC ............ *G03F 7/7015* (2013.01); *G02B 7/1815* (2013.01); *G02B 26/0816* (2013.01);
(Continued)

(58) Field of Classification Search
CPC ............ G02B 7/1815; G02B 26/0833–26/085; G03F 7/70075; G03F 7/70116; G03F 7/7015; G03F 7/70291; G03F 7/70508; G03F 7/70875; G03F 7/70891
USPC ............. 355/53, 67, 77; 359/224.2, 237, 290, 359/291, 850, 851, 865, 904
See application file for complete search history.

(56) References Cited

U.S. PATENT DOCUMENTS 6,583,854 B1   6/2003   Hazama et al.
6,658,084 B2   12/2003  Singer (Continued)

FOREIGN PATENT DOCUMENTS

DE   10200244 A1   7/2003
DE   10302664      7/2004

(Continued)

OTHER PUBLICATIONS

International Search Report for the corresponding PCT Application No. PCT/EP2009/007476, mailed Aug. 5, 2010.

(Continued)

*Primary Examiner* — Colin Kreutzer
(74) *Attorney, Agent, or Firm* — Fish & Richardson P.C.

(57) ABSTRACT

An optical module includes a chamber capable of being evacuated and a mirror in the chamber. The mirror includes a plurality of individual mirrors. Each individual mirror includes: a mirror body including a reflection face; a support structure; and a thermally conductive portion that mechanically connects the support structure to the mirror body. For at least one individual mirror, the thermally conductive portion includes a plurality of thermally conductive strips arranged radially, adjacent thermally conductive strips being separated from each other, and each of the plurality of thermally conductive strips connecting the mirror body to the support structure. For at least one individual mirror, an actuator is associated with the mirror body, the actuator being configured to displace the mirror body relative to the support structure in at least one degree of freedom.

40 Claims, 23 Drawing Sheets

(51) Int. Cl.
  *G03B 27/54* (2006.01)
  *G03F 7/20* (2006.01)
  *G02B 7/18* (2006.01)
  *G02B 26/08* (2006.01)

(52) U.S. Cl.
  CPC ........ *G02B26/0833* (2013.01); *G03F 7/70075* (2013.01); *G03F 7/70116* (2013.01); *G03F 7/70291* (2013.01); *G03F 7/70891* (2013.01)

(56) References Cited

U.S. PATENT DOCUMENTS

| | | |
|---|---|---|
| 7,015,489 B2 | 3/2006 | Singer et al. |
| 7,145,269 B2 | 12/2006 | Hol et al. |
| 2002/0074115 A1 | 6/2002 | Dieker |
| 2003/0123128 A1 | 7/2003 | Park |
| 2003/0202234 A1 | 10/2003 | Taylor et al. |
| 2004/0179257 A1 | 9/2004 | Gurcan |
| 2004/0239908 A1 | 12/2004 | Bleeker et al. |
| 2005/0111786 A1 | 5/2005 | Boie et al. |
| 2006/0103908 A1 | 5/2006 | Loopstra et al. |
| 2006/0114438 A1 | 6/2006 | Bleeker et al. |
| 2006/0209313 A1 | 9/2006 | Van Den Akker et al. |
| 2007/0091485 A1 | 4/2007 | Phillips et al. |
| 2007/0206169 A1 | 9/2007 | Butler |
| 2008/0013097 A1 | 1/2008 | del Puerto |
| 2009/0002668 A1 | 1/2009 | Rohe et al. |
| 2010/0007866 A1 | 1/2010 | Warm et al. |
| 2011/0181852 A1* | 7/2011 | Bleidistel et al. ............... 355/30 |

FOREIGN PATENT DOCUMENTS

| | | |
|---|---|---|
| DE | 10324796 A1 | 12/2004 |
| EP | 1 225 481 A | 7/2008 |
| EP | 2 009 501 A2 | 12/2008 |
| JP | 2001-154371 | 6/2001 |
| JP | 2002-198305 | 7/2002 |
| JP | 2004-363598 | 12/2004 |
| JP | 2005-276932 | 10/2005 |
| JP | 2006-140504 | 6/2006 |
| JP | 2007-234717 | 9/2007 |
| JP | 2007-258695 | 10/2007 |
| JP | 2008-003608 | 10/2008 |
| JP | 2010-519725 | 6/2010 |
| WO | WO 02/10836 A2 | 2/2002 |
| WO | WO 2007/134574 A | 11/2007 |
| WO | WO 2008/101656 A2 | 8/2008 |

OTHER PUBLICATIONS

"Flipchiptechnologie" of HMT Microelectronic AG, Biel, Switzerland, callable under the link http://www.hmt.ch/techdetail.jsp?ID_Page=10000H_10000F&ID_Group=100001.

English translation of German Office Action for corresponding DE Appl No. 10 2009 009 568.3, dated Jun. 22, 2011.

Chinese Office Action, with English translation, issued in corresponding Chinese Application No. 200980151391.4 on Nov. 5, 2012.

Japanese Office Action, with English translation, issued in JPO 2011-531406 on Feb. 5, 2013.

"Baugruppentechnologie der Elektronik-Montage" ["Technology of Electronic Assembly Units"] Editor: Wolfgang Scheel, 2nd edition, Verlag Technik, Berlin, 1999, with English translation.

* cited by examiner

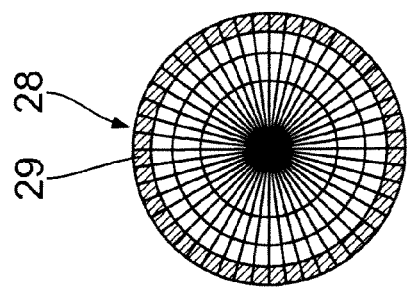
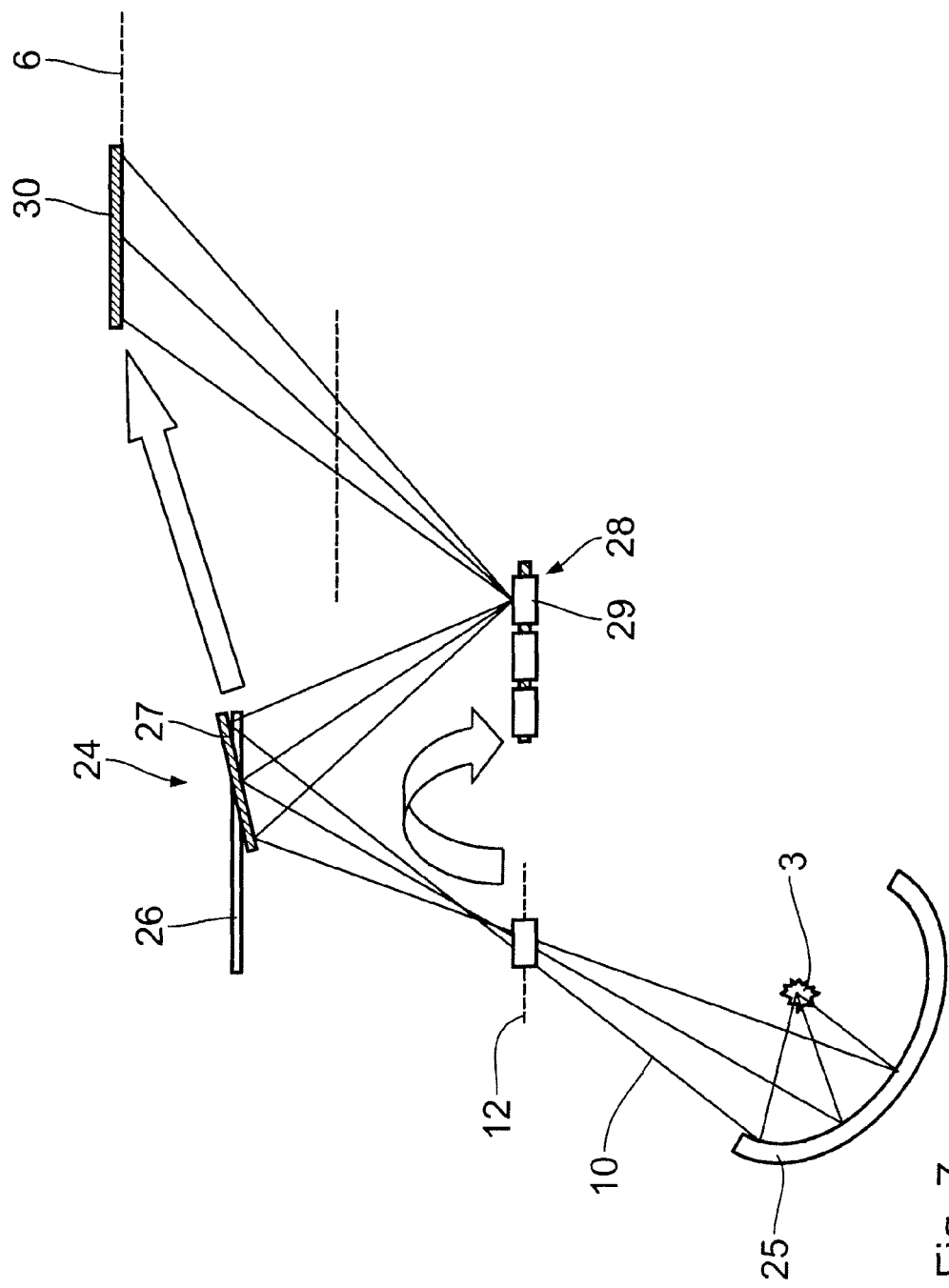
Fig. 8
Fig. 7

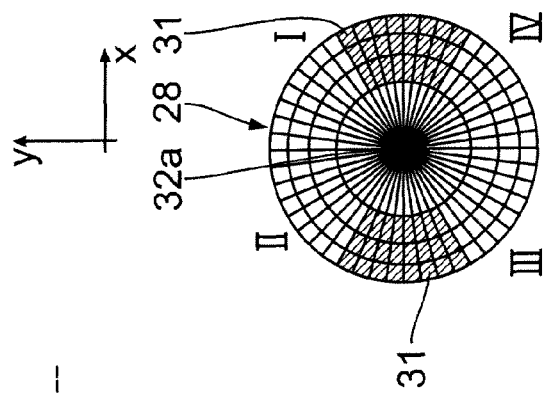
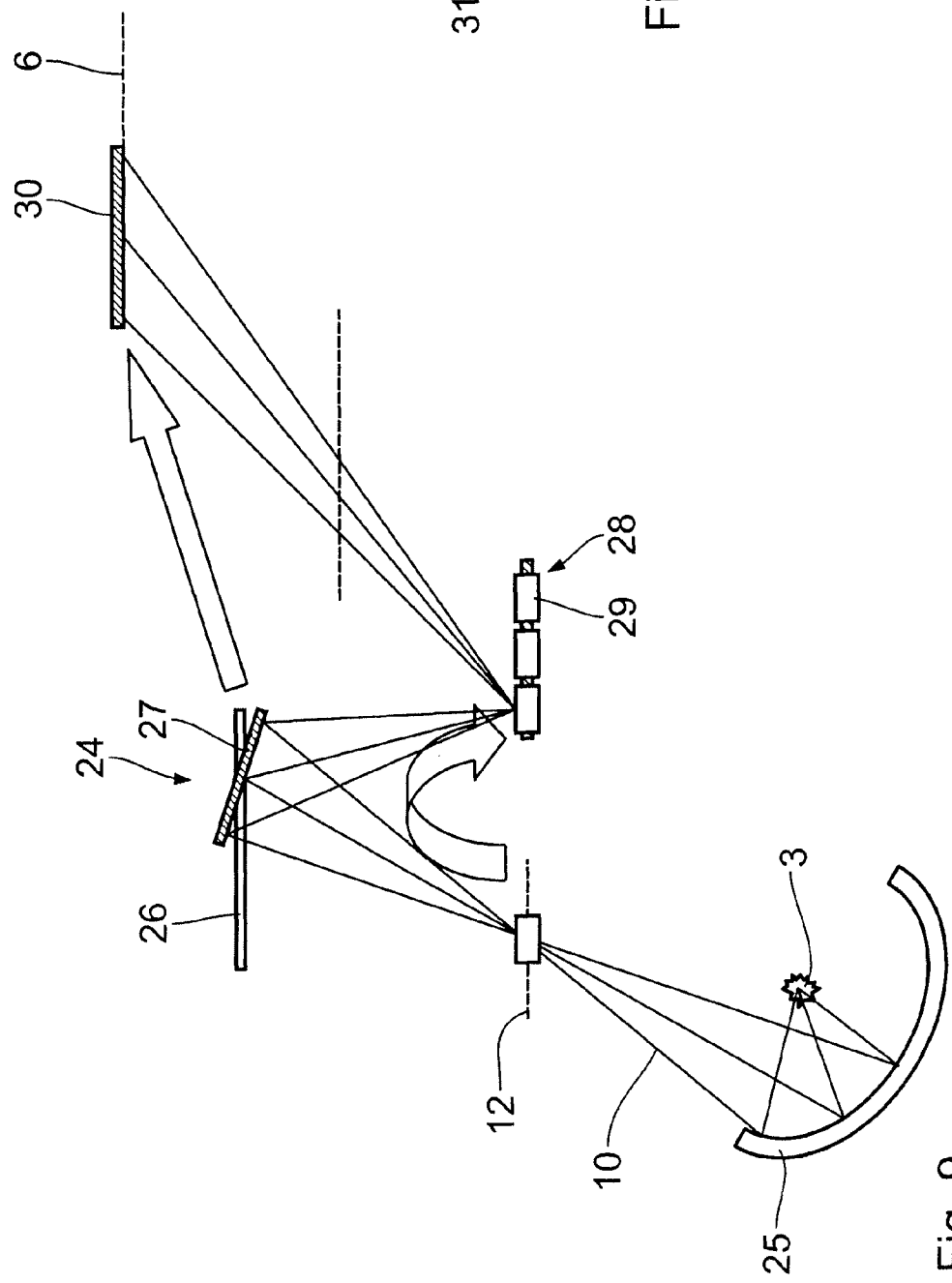
Fig. 10
Fig. 9

OPTICAL MODULE FOR GUIDING A RADIATION BEAM

CROSS-REFERENCE TO RELATED APPLICATIONS

This application is a divisional of, and claims benefit under 35 USC 120 to, U.S. application Ser. No. 13/075,929, filed Mar. 30, 2011, which is a continuation of, and claims benefit under 35 USC 120 to, international application PCT/EP2009/007476, filed Oct. 19, 2009, which claims benefit under 35 USC 119 of German Application No. 10 2009 034 502.7, filed Jul. 24, 2009; German Application No. 10 2009 009 568.3, filed Feb. 19, 2009; and German Application No. 10 2008 052 153.1, filed Oct. 20, 2008. International application PCT/EP2009/007476 also claims benefit under 35 USC 119(e) of U.S. Ser. No. 61/153,705, filed Feb. 19, 2009. U.S. application Ser. No. 13/075,929 and international application PCT/EP2009/007476 are hereby incorporated by reference in their entirety.

FIELD

The disclosure relates to an optical module for guiding an EUV radiation beam. The disclosure further relates to a method for activating individual mirrors of an optical module of this type, a mirror for use in an optical module of this type, an illumination optical system for a microlithography projection exposure system for illuminating an object field with illumination light from a radiation source, an illumination system with an illumination optical system of this type and the radiation source, a projection exposure system with an illumination system of this type, a method for producing a microstructured component with a projection exposure system of this type, and a microstructured or nanostructured component produced by a method of this type.

BACKGROUND

An optical module with a mirror including a plurality of individual mirrors, which can be displaced by actuator, is known from U.S. Pat. No. 6,658,084 B2.

During operation of an illumination optical system for microlithography projection exposure system, thermal energy can be deposited in the individual mirrors, in particular during operation with EUV (Extreme Ultra Violet) radiation in the range between 5 nm and 30 nm. In some cases, such systems can be operated only with an intolerably low radiation output for demanding illumination tasks. In certain cases, such systems can be operated only with intolerably high losses with regard to the radiation throughput (with regard to the ratio between the used and the produced EUV radiation).

SUMMARY

The present disclosure provides an optical module configured so that an illumination optical system constructed with the optical module can provide a high radiation or illumination light throughput, even with a non-negligible thermal load on the individual mirrors.

In some embodiments, according to a first aspect, an optical module reduces the demands on the properties for a signal transmission between the central control device and the actuators of the individual mirrors. The integrated electronic displacement circuits associated with the individual mirrors in spatial proximity take on at least some of the signal processing tasks, which are otherwise reserved for the central control device. As a result, circuit arrangements can be realised for the actuators, in which, overall in the region of the optical module, a more favourable ratio of the compact structure, residual heat occurring and parasitic electromagnetic fields is realised. The radiation beam, which is guided the optical module, may be a part radiation beam, in other words, a part of an overall radiation beam. The radiation beam which can be guided by way of the optical module may be a EUV radiation beam.

In some embodiments, integrated electronic displacement circuits lead to the possibility of activating a plurality of displacement circuits of this type together, for example by a serial bus system. This allows a further simplified structure to activate the actuators of the optical module.

In some embodiments, an accommodation allows a compact structure of the optical module.

An activation of the actuators via protective extra-low voltage avoids a danger coming from higher voltage. A protective extra-low voltage is, in this case, taken to mean a voltage, which is less than 48 V. An activation of the integrated electronic displacement circuits can take place via a voltage which is less than 20 V, less than 10 V and in particular less than 5 V. In particular, activation voltages of +/−1 V may be used. The power properties of Lorentz actuators is then released in situ via the integrated electronic displacement circuits, so Lorentz actuators with a small number of turns per unit length of the coils used to produce the magnetic field may be used.

In some embodiments, a line arrangement avoids the production of undesired interfering magnetic fields.

In some embodiments, an arrangement allows the use of short connection lines between the integrated electronic displacement circuit and the individual coils of the Lorentz actuator.

In some embodiments, a multi-layer structure of the activation circuit boards allows a compact electrical connection technique.

In some embodiments, a substrate layer allows a dissipation of heat with simultaneously high mechanical stability. Examples of the material of the substrate layer are ceramic materials, silicon, silicon dioxide, aluminium nitrite and aluminium oxide, for example $Al_2O_3$-ceramic. The activation circuit board of this substrate layer may be produced via CPC (Copper Plated Ceramic) technology, via LTCC (Low Temperature Cofired Ceramics) technology or via HTCC—(High Temperature Cofired Ceramics) technology or similar type-related technologies.

In some embodiments, a heat sink allows good heat dissipation of a heat input, which, on the one hand, is input by residual absorption of useful radiation reflected by the mirror of the optical module and, on the other hand, is input by the supply of the actuators.

In some embodiments, heat sink fingers allow an efficient dissipation of heat from the activation circuit board.

In some embodiments, a permanent magnet has proven successful in use in a Lorentz actuator. The permanent magnet may be configured as a samarium cobalt magnet. Possible alternatives are all the highly magnetic magnet material combinations suitable for a vacuum. Depending on the filling gas of an optionally present low-pressure environment, in which the Lorentz actuator is arranged, other magnetic materials may also be used, such as, for example, neodymium-iron-boron (NdFeB).

In some embodiments, an association is an advantageous compromise which efficiently uses the efficiency of an integrated electronic displacement circuit and allows a compact arrangement.

In some embodiments, a division into part individual mirror assays improves the variability of the individual mirror activation.

According to the disclosure, it was recognised according to a second aspect that operation in a vacuum significantly increases the throughput, in particular in the case of small wavelengths of the illumination light in the EUV range, as illumination light losses caused by the atmosphere are avoided. Gas is no longer required in this case as the heat transport medium. In some embodiments, the optical module, because of thermally conductive portions with a heat dissipation power density of at least 1 kW/m², can ensure that optical or electric power absorbed by the mirror bodies, in other words non-reflected power, is efficiently dissipated by the mirror bodies to the support structure. An overheating of the mirror bodies, which could, for example, lead to the destruction of highly reflective coatings on the mirror bodies, is avoided despite the operation of the mirror bodies in the evacuated chamber. Because of the thermally conductive portions with the high heat dissipation power density according to the disclosure, a convection dissipation of heat from the mirror bodies or heat dissipation from the mirror bodies by heat conduction by a gas medium do not matter. A vacuum operation of the mirror of the optical module leading to lower EUV radiation losses is then possible without overheating the individual mirrors. The displacement degree of freedom of the mirror body relative to the support structure is at least one tilting and/or translation degree of freedom. The reflection face of one of the mirror bodies may have an extent of 0.5 mm×0.5 mm, 1 mm×1 mm, 4 mm×4 mm, 8 mm×8 mm or else 10 mm×10 mm. The reflection face of one of the mirror bodies may also deviate from the square form. The thermally conductive portions may also be configured to dissipate a greater power density absorbed by the mirror bodies. Per mirror body, a power density of 2 kW/m², of 5 kW/m², of 10 kW/m², of 20 kW/m², of 50 kW/m² or of 100 kW/m² may be dissipated to the support structure, for example, by one of the thermally conductive portions. The thermally conductive portions may be configured to dissipate a thermal power of at least 50 mW absorbed by the mirror bodies to the support structure. Per mirror body, a power of 100 mW, of 150 mW or of 160 mW may, for example, be dissipated to the support structure by one of the thermally conductive portions.

In some embodiments, actuators allow the use of comparatively rigid thermally conductive portions, which may in turn have an advantageously high heat dissipation capacity.

In some embodiments, this applies, in particular, to Lorentz actuators with which high actuator forces can be realised. Lorentz actuators are known, in principle, from U.S. Pat. No. 7,145,269 B2.

In some embodiments, a current-carrying actuator component leads to the possibility of a structure of the actuator with a high integration density.

In some embodiments, a plurality of layers of printed-on conductor paths, for example, allow various orientations of the conductor paths per printed-on layer and/or various conductor path cross sections per printed-on layer. Various force directions of the actuator to realise various displacement degrees of freedom and/or various force levels of the displacement can thus be realised.

In some embodiments, reluctance actuators, which are, for example, known from WO2007/134574A, likewise allow high actuator forces.

In some embodiments, the same applies to piezo actuators.

The optical element may be mounted by a bearing system based on solid body joints in such a way that it is adequately resilient in the actuated degrees of freedom in order to achieve the desired deflection with the actuator forces available. Simultaneously, the bearing may be such that the non-actuated degrees of freedom have adequate rigidity and that the bearing system can dissipate an adequate thermal power density or an adequate absolute thermal power. In order to increase the heat conductivity, it is conceivable to use additional thermally conductive elements or thermally conductive portions, which may have a relatively low mechanical rigidity.

In some embodiments, a plurality of thermally conductive strips ensure an appropriate elasticity of the thermally conductive strips to displace the mirror body, in which good heat dissipation is simultaneously made possible via the plurality of thermally conductive strips.

In some embodiments, an active cooling of the support structure again improves the thermal balance of the optical module. The active cooling may, for example, be water cooling and/or Peltier cooling.

In some embodiments, an integration density of at least 0.5 ensures a low illumination light loss in the region of the intermediate spaces between the mirror bodies.

In some embodiments, a matrix-like (line-wise and column-wise) arrangement of the mirror bodies can be realised with a very high integration density.

In some embodiments, if the mirror bodies are the facets of a facet mirror, a configuration of an exposure optical system with an optical module with a mirror body of this type is possible, in which an object field is completely illuminated by one of the mirror bodies in each case. It is alternatively possible to realise a single facet of this type of a facet mirror by a plurality of individual mirrors of this type. This increases the flexibility of the illumination optical system.

In some embodiments, an optical module leads to a particularly good compromise between good mobility, on the one hand, and good heat transfer, on the other hand. The thermally conductive portions according to this third aspect may be configured to dissipate a thermal power density of at least 1 kW/m² absorbed by the mirror bodies to the support structure. Each of the thermally conductive portions may have two, three or else a larger number of thermally conductive strips. The thermally conductive portions may be part of a slotted membrane. Adjacent thermally conductive strips may be spaced apart from one another by slots in a membrane of this type. The actuator may have an actuator pin connected to the mirror body and extending perpendicular to a mirror plane and/or perpendicular to a membrane plane of the slotted membrane. Adjusting forces on an actuator pin of this type may extend parallel to the membrane plane. The thermally conductive portion with the thermally conductive strips may, in particular when it is configured as a membrane, be configured such that the actuator pin, upon the action of actuating forces of this type running parallel to the membrane plane, does not undesirably give way by an overall translatory displacement of the actuator pin.

In some embodiments, an arrangement of the thermally conductive strips allows a design of the thermally conductive portions such that for an actuation of the individual mirrors, easily manageable force ratios are ensured with regard to a response force of the thermally conductive portion to a force applied from outside by actuator.

In some embodiments, intermediate spaces ensure mobility of the thermally conductive portion and therefore mobility of the mirror body relative to the support structure. Two, three or else a larger number of thermally conductive strips may follow one another between the inner and the outer connection portion. Accordingly, in this configuration, a plurality of thermally conductive strips follows one another in the peripheral direction around the inner connection portion.

In some embodiments, a spiral configuration, for example, two to four spiral thermally conductive strips, may be used per thermally conductive portion. Each thermally conductive strip may form between one and two revolutions around a centre or a central axis. A peripheral extent of the respective thermally conductive strip around the centre of the spiral, which is between 360° and 540° and, in particular in the region of 420°, is preferred. As an alternative to a spiral configuration, the thermally conductive strips between the radially inner connection portion of the thermally conductive portion and the radially outer connection portion of the thermally conductive portion may be configured in a C-shape or S-shape in plan view. A combination of the configurations "spiral shape", "C-shape" and "S-shape" is also possible.

In some embodiments, an electrode arrangement allows an electrostatic actuation of the individual mirrors.

In some embodiments, a plurality of counter-electrodes allows a reproducible predetermination over several tilting degrees of freedom of the respective individual mirror.

The features described above of the optical modules may be combined with one another.

The disclosure also provides an activation or controlling method for an optical module with individual mirrors arranged line-wise and column-wise, with associated integrated electronic displacement circuits. The disclosure provides a method to achieve this. The method can be used to activate an optical module according to the first aspect.

The activation method according to the disclosure avoids each individual mirror lens being activated separately. The activation of an overall individual mirror column reduces the complexity of the control words to be transmitted to activate the individual mirrors. This simplifies the control logics.

In some embodiments, an activation of a plurality of part individual mirror arrays increases the activation flexibility for the optical module.

In some embodiments, a check of the control values transmitted allows identification of communication or hardware faults that occur.

The advantages of a mirror, an illumination optical system, an illumination system, a projection exposure system, a production method, and a structured component correspond to those which have already been described above with reference to the optical module according to the disclosure. When using an illumination system with an EUV radiation source with a produced useful radiation in the range of 5 nm to 30 nm, the advantages of the optical module according to the disclosure come to the fore particularly well.

BRIEF DESCRIPTION OF THE DRAWINGS

Embodiments of the disclosure will be described in more detail below with the aid of the drawings, in which:

FIG. 7 shows the illumination optical system according to FIG. 5 with a repositioned channel association of the multi-mirror array with the pupil facet mirror;

FIG. 8 schematically shows a plan view of the pupil facet mirror according to FIG. 7 with a pupil facet illumination, which corresponds to an annular illumination setting;

FIG. 9 shows the illumination optical system according to FIG. 5 with a repositioned channel association of the multi-mirror array with the pupil facet mirror;

FIG. 10 schematically shows a plan view of the pupil facet mirror according to FIG. 9 with a pupil facet illumination, which corresponds to a dipole illumination setting;

FIG. 22 shows, in a view similar to FIG. 14, a detail enlargement of a further configuration of an individual mirror in the region of a spacer and an actuator pin and a thermally conductive portion located in between;

Detailed Description

Figure 1:
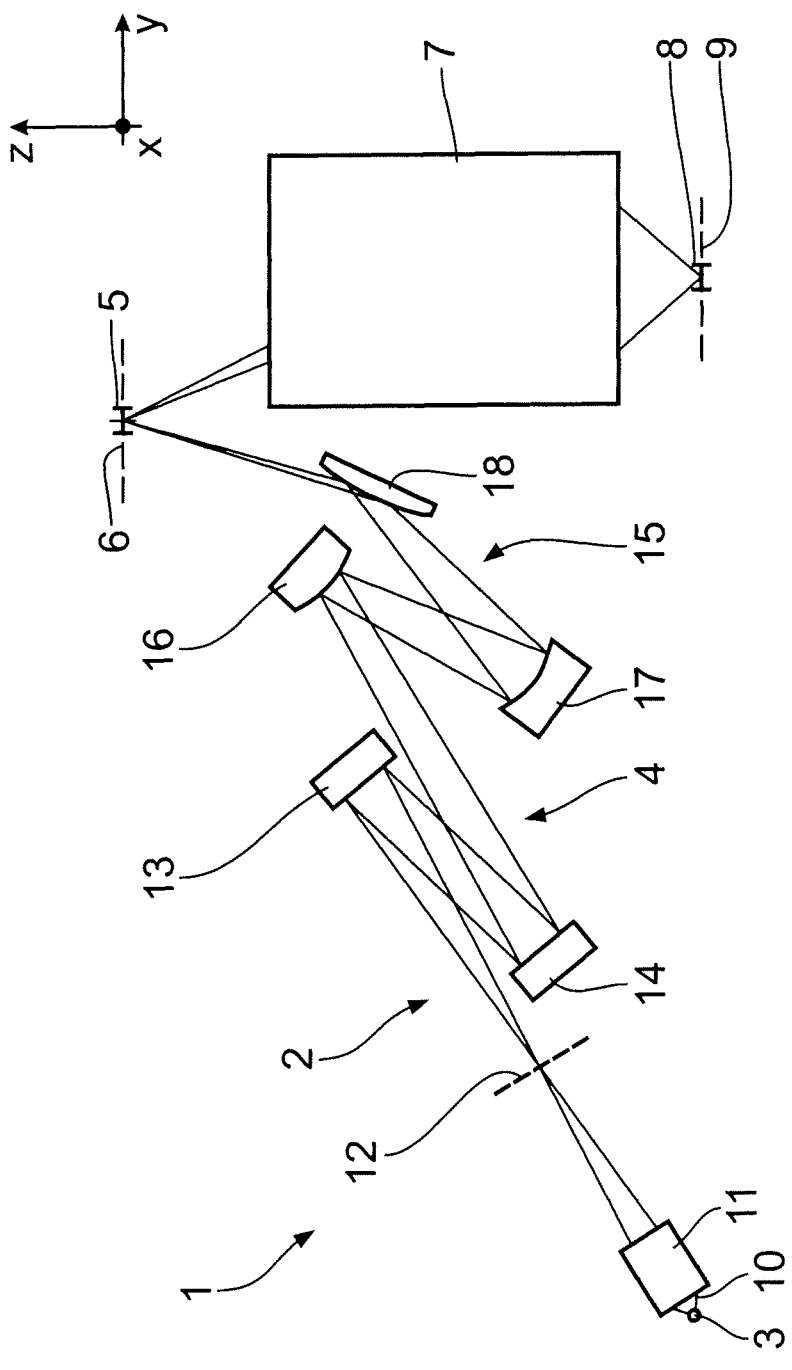
FIG. 1 schematically shows a projection exposure system for microlithography with an illumination optical system shown in meridional section and a projection optical system.

FIG. 1 schematically shows, in a meridional section, a projection exposure system 1 for microlithography. An illumination system 2 of the projection exposure system 1, apart from a radiation source 3, has an illumination optical system 4 to expose an object field 5 in an object plane 6. The object field 5 may be designed in a rectangular or arcuate manner with an x/y-aspect ratio of, for example, 13/1. Exposed here is a reflective reticle, not shown in FIG. 1, arranged in the object field 5 and carrying a structure to be projected with the projection exposure system 1 to produce microstructured or nanostructured semiconductor components. A projection optical system 7 is used to image the object field 5 in an image field 8 in an image plane 9. The structure on the reticle is imaged on a light-sensitive layer of a wafer, which is arranged in the region of the image field 8 in the image plane 9 and is not shown in the drawing.

The reticle, which is held by a reticle holder, not shown, and the wafer, which is held by a wafer holder, not shown, are synchronously scanned in the y-direction during operation of the projection exposure system 1. Depending on the imaging scale of the projection optical system 7, a scanning of the reticle in the opposite direction relative to the wafer can also take place.

The radiation source 3 is an EUV radiation source with an emitted useful radiation in the range between 5 nm and 30 nm. This may be a plasma source, for example a GDPP source (Gas Discharged Produced Plasma) or an LPP source (Laser Produced Plasma). Other EUV radiation sources, for example those which are based on a synchrotron or on a free electron laser (FEL), are possible.

EUV radiation 10, which is emitted from the radiation source 3, is bundled by a collector 11. A corresponding collector is known, for example, from EP 1 225 481 A. After the collector 11, the EUV radiation 10 propagates through an intermediate focus plane 12, before it impinges on a field facet mirror 13. The field facet mirror 13 is arranged in a plane of the illumination optical system 4, which is optically conjugated with the object plane 6.

The EUV radiation 10 will also be called useful radiation, illumination light or imaging light below.

After the field facet mirror 13, the EUV radiation 10 is reflected by a pupil facet mirror 14. The pupil facet mirror 14 is either located in the entry pupil plane of the illumination optical system 7 or in a plane optically conjugated with this. The field facet mirror 13 and the pupil facet mirror 14 are constructed from a plurality of individual mirrors, which will be described in more detail below. In this case, the division of the field facet mirror 13 into individual mirrors may be such that each of the field facets, which separately illuminate the entire object field 5, is represented by precisely one of the individual mirrors. Alternatively, it is possible to construct at least some or all of the field facets by a plurality of individual mirrors of this type. The same applies to the configuration of the pupil facets of the pupil facet mirror 14 in each case associated with the field facets, which can in each case be formed by a single individual mirror or by a plurality of individual mirrors of this type.

The EUV radiation 10 impinges on the two facet mirrors 13, 14 at an angle of incidence, which is less than or equal to 25°. The two facet mirrors are therefore impinged upon in the region of a normal incidence operation by the EUV radiation 10. Grazing incidence impingement is also possible. The pupil facet mirror 14 is arranged in a plane of the illumination optical system 4, which is a pupil plane of the projection optical system 7 or is optically conjugated to a pupil plane of the projection optical system 7. With the aid of the pupil facet mirror 14 and an imaging optical module in the form of a transmission optical system 15 with mirrors 16, 17 and 18 designated in the order of the beam path for the EUV radiation 10, the field facets of the field facet mirror 13 are imaged overlapping one another in the object field 5. The last mirror 18 of the transmission optical system 15 is a grazing incidence mirror. The transmission optical system 15, together with the pupil facet mirror 14, is also called a following optical system to transfer the EUV radiation 10 from the field facet mirror 13 to the object field 5. The illumination light 10 is guided from the radiation source 3 to the object field 5 by way of a plurality of illumination channels. Associated with each of these illumination channels is a field facet of the field facet mirror 13 and a pupil facet of the pupil facet mirror 14 arranged downstream thereof. The individual mirrors of the field facet mirror 13 and of the pupil facet mirror 14 may be tilted by actuator, so a change of the association of the pupil facets with the field facets and, accordingly, a changed configuration of the illumination channels can be achieved. Different illumination settings result, which differ with respect to the distribution of the illumination angles of the illumination light 10 over the object field 5.

To facilitate the explanation of positional relationships, a global Cartesian xyz-coordinates system will be used below inter alia. The x-axis extends in FIG. 1 perpendicular to the plane of the drawing toward the observer. The y-axis runs to the right in FIG. 1. The z-axis runs upwardly in FIG. 1.

A local Cartesian xyz-coordinates system is drawn in selected ones of the following figures, the x-axis running parallel to the x-axis according to FIG. 1 and the y-axis with this x-axis spanning the optical face of the respective optical element.

Figure 2:
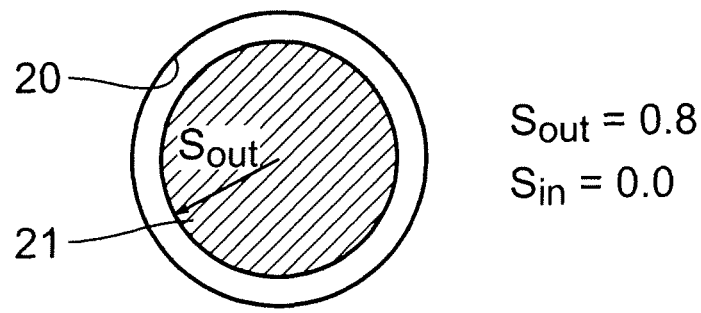
FIG. 2 shows an illumination of an entry pupil of the projection optical system in the form of a conventional illumination setting.

FIG. 2 shows a first illumination setting, which can be achieved with the illumination optical system 4 according to FIG. 1 and which is called a conventional illumination setting or a small conventional illumination setting. An intensity distribution of the illumination light 10 in an entry pupil of the projection optical system 7 is shown. The entry pupil may be maximally illuminated up to a circular pupil edge 20.

In the conventional illumination setting, within the pupil edge 20, a circular pupil region 21 concentric thereto is illuminated. An outer radius Sout of the conventional pupil illumination region with respect to the radius Smax of the pupil edge 20 behaves as follows: Sout/Smax=0.8.

Figure 3:
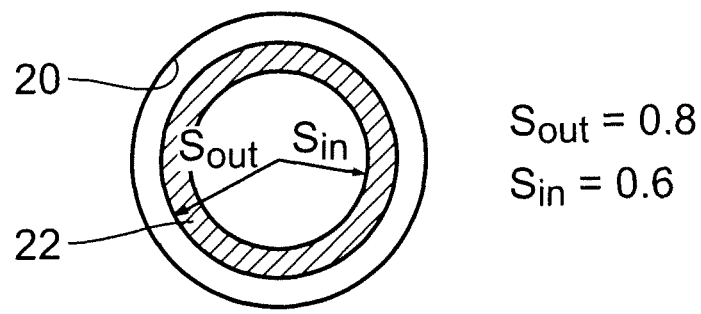
FIG. 3 shows an illumination of an entry pupil of the projection optical system in the form of an annular, in other words ring-shaped illumination setting.

FIG. 3 shows the illumination conditions in a further illumination setting, which can be adjusted with the illumination optical system 4 according to FIG. 1 and which is called an annular illumination setting. A ring-shaped pupil region 22 is illuminated here. An outer radius Sout of the pupil region 22 is as large here as that of the pupil region 21 in the conventional illumination ring according to FIG. 2. An inner radius Sin, in the annular pupil region 22 with respect to the radius Smax of the pupil edge 20 behaves as follows: Sin/Smax=0.6.

Figure 4:
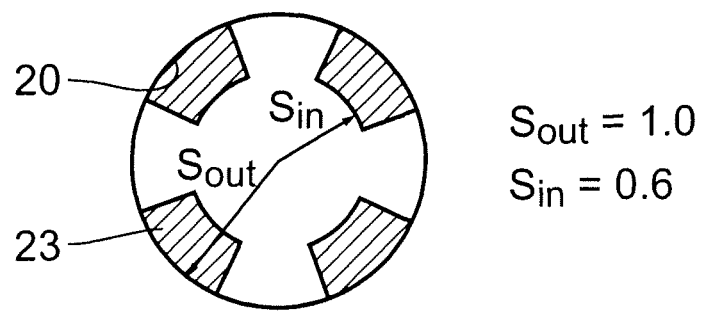
FIG. 4 shows an illumination of an entry pupil of the projection optical system in the form of a 45° quadrupole illumination setting.

FIG. 4 shows a further illumination setting, which can be adjusted with the illumination optical system 4 according to FIG. 1 and which is called a 45° quadrupole or 45° quasar illumination setting. Illuminated in the entry pupil of the projection optical system 7, within the pupil edge 20, are four ring sector-shaped pupil regions 23, which are arranged in the four quadrants of the entry pupil. Each of the pupil regions 23, in this case, around the centre of the pupil edge 20, passes over a peripheral angle of 45°. The quasar pupil regions 23 are limited toward the centre of the pupil edge 20 by an inner radius Sin, which corresponds to the inner radius of the annular pupil region 22 according to FIG. 3. The quasar pupil regions 23 are limited outwardly by the pupil edge 20.

The various illumination settings according to FIGS. 2 to 4 and predetermined further illumination settings may be achieved via corresponding tilting of the individual mirrors of the field facet mirror 13 and a corresponding change of the association of these individual mirrors of the field facet mirror 13 with the individual mirrors of the pupil facet mirror 14. Depending on the tilting of the individual mirrors of the field facet mirror 13, the individual mirrors of the pupil facet mirror 14 newly associated with these individual mirrors are repositioned by tilting in such a way that an imaging of the field facets of the field facet mirror 13 in the object field 5 is in turn ensured.

Figure 5:
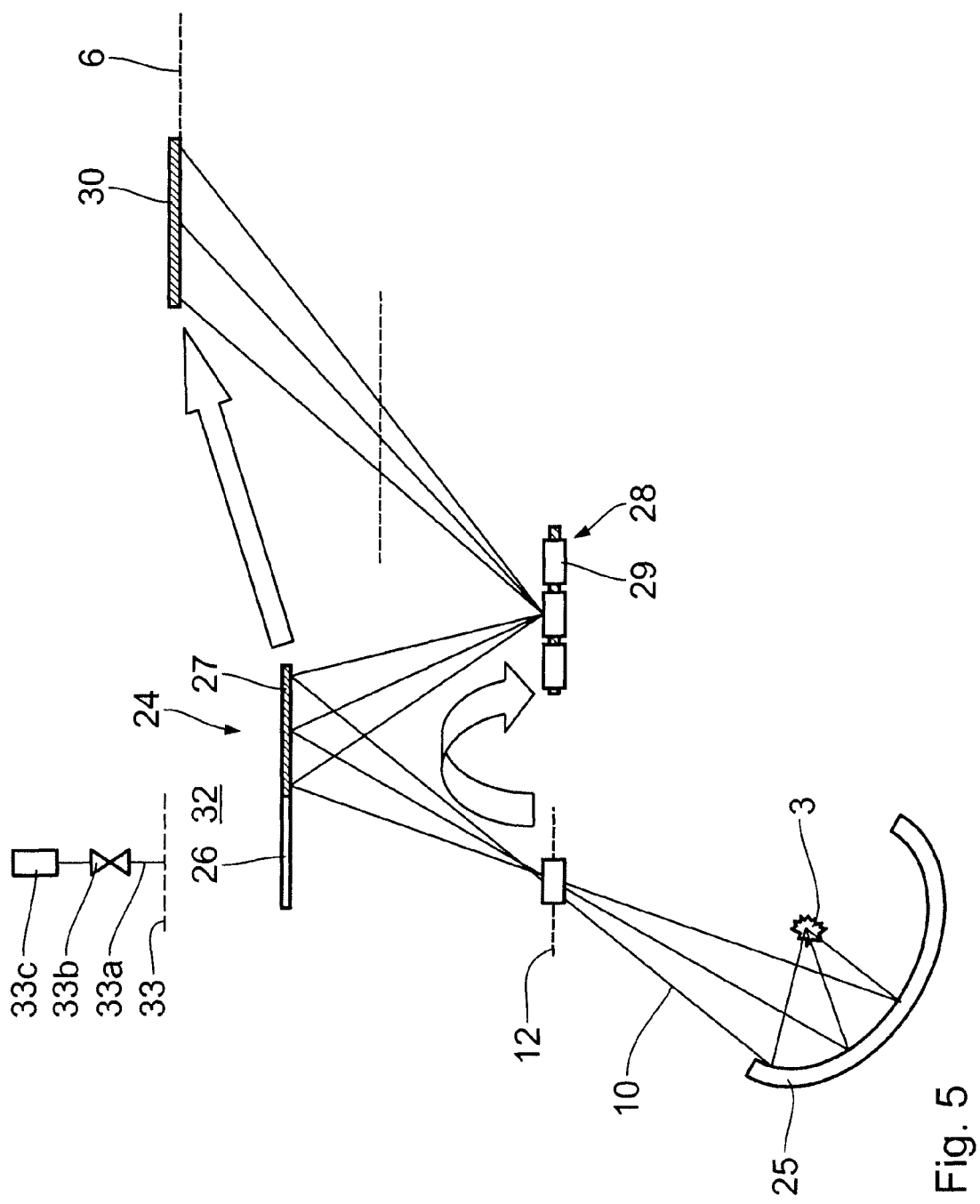
FIG. 5 shows a further configuration of an illumination optical system of the projection exposure system according to FIG. 1 with a multi-mirror array (MMA) and a pupil facet mirror illuminated thereby.

FIG. 5 shows an alternative configuration of an illumination optical system 24 for the projection exposure system 1. Components which correspond to those which have already been described above with reference to FIGS. 1 to 4, have the same reference numerals and will not be discussed again in detail.

Useful radiation 10 emitted from the radiation source 3, which may also be configured as an LPP source, is firstly collected by a first collector 25. The collector 25 may be a parabolic mirror, which images the radiation source 3 in the intermediate focus plane 12 or focuses the light of the radiation source 3 on the intermediate focus in the intermediate focus plane 12. The collector 25 can be operated in such a way that it is impinged on by the useful radiation 10 at angles of incidence close to 0°. The collector 25 is then operated close to the normal incidence and therefore also called a normal incidence (NI) mirror. A collector operated at grazing incidence may also be used instead of the collector 25.

In the illumination optical system 24, a field facet mirror 26 in the form of a multi-mirror or micro-mirror array (MMA), as an example of an optical module to guide the useful radiation 10, in other words the EUV radiation beam, is arranged downstream of the intermediate focus plane 12. The field facet mirror 26 is configured as a micro-electromechanical system (MEMS). It has a plurality of individual mirrors 27 arranged in an array line-wise and column-wise in a matrix-like manner. The individual mirrors 27 can be tilted by actuator, as will be explained below in more detail. Overall, the field facet mirror 26 has about 100,000 of the individual mirrors 27. Depending on the size of the individual mirrors 27, the field facet mirror 26 may also have, for example, 1,000, 5,000, 7,000 or else several hundred thousand, for example 500,000 individual mirrors 27.

A spectral filter may be arranged in front of the field facet mirror 26 and separates the useful radiation 10 from other wavelength components, which cannot be used for the projection exposure, of the emission of the radiation source 3. The spectral filter is not shown.

The field facet mirror 26 is impinged upon by useful radiation 10 with the power of 840 W and a power density of 6.5 kW/m$^2$.

The overall individual mirror array of the facet mirror 26 has a diameter of 500 mm and is densely packed with the individual mirrors 27. The individual mirrors 27, as long as a field facet is realised by precisely one individual mirror, in each case, except for a scaling factor, represent the form of the object field 5. The facet mirror 26 may be formed from 500 individual mirrors representing a field facet, in each case, with a dimension of about 5 mm in the y-direction and 100 mm in the x-direction. As an alternative to realising each field facet by precisely one individual mirror 27, each of the field facets may be approximated by groups of smaller individual mirrors 27. One field facet with dimensions of 5 mm in the y-direction and of 100 mm in the x-direction may, for example, be constructed by a 1×20 array of individual mirrors 27 with the dimension 5 mm×5 mm through to a 10×200 array of individual mirrors 27 with the dimensions 0.5 mm×0.5 mm. The surface covering of the complete field facet array by the individual mirrors 27 may be 70% to 80%.

From the individual mirrors 27 of the facet mirror 26, the useful light 10 is reflected to a pupil facet mirror 28. The pupil facet mirror 28 has about 2,000 static pupil facets 29. These are arranged next to one another in a plurality of concentric rings, so the pupil facet 29 of the innermost ring is sector-like in design and the pupil facets 29 of the rings directly adjacent thereto are ring sector-like in design. 12 pupil facets 29 may be present next to one another in one quadrant of the pupil facet mirror 28 in each of the rings. Each of the ring sectors shown in FIG. 6 is in turn formed by a plurality of individual mirrors 27.

The useful light 10 is reflected by the pupil facets 29 to a reflective reticle 30, which is arranged in the object plane 6. The projection optical system 7 then follows, as shown above in conjunction with the projection exposure system according to FIG. 1. A transmission optical system can in turn be provided between the facet mirror 28 and the reticle 30, as explained above in conjunction with the illumination optical system 4 according to FIG. 1.

Figure 6:
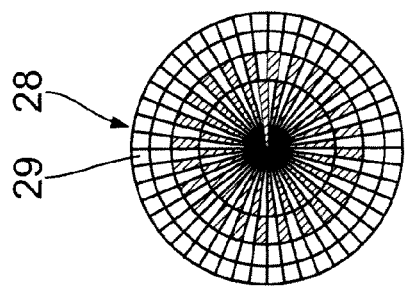
FIG. 6 schematically shows a plan view of the pupil facet mirror according to FIG. 5 with a pupil facet illumination, which corresponds to an illumination setting.

By way of example, FIG. 6 shows an illumination of the pupil facets 29 of the pupil facet mirror 28, with which approximately the conventional illumination setting according to FIG. 2 can be achieved. In the two inner pupil facet rings of the pupil facet mirror 28, every second one of the pupil facets 29 is illuminated in the peripheral direction. This alternating illumination view in FIG. 6 is to symbolise that the filling density realised in this illumination setting is smaller by a factor of 2 than in an annular illumination setting. A homogeneous illumination distribution is also aimed for in the two inner pupil facet rings but with an occupation density which is smaller by a factor of 2. The two outer pupil facet rings shown in FIG. 6 are not illuminated.

FIG. 7 schematically shows the conditions in the illumination optical system 24, if an annular illumination setting is adjusted there. The individual mirrors 27 of the field facet mirror 26 are tilted by actuator with the aid of actuators explained below, so, on the pupil facet mirror 28, an outer ring of the ring sector-like pupil facet 29 is illuminated with the useful light 10. This illumination of the pupil facet mirror 28 is shown in FIG. 8. The tilting of the individual mirrors 27 to produce this illumination is indicated by way of example in FIG. 7 using the example of an individual mirror 27.

FIG. 9 schematically shows the conditions in the illumination optical system 24, if a dipole setting is adjusted there.

FIG. 10 shows the illumination of the pupil facet mirror 28 belonging to this dipole illumination setting. Two ring sectors at the transition between the second and third and at the transition between the first and fourth quadrant of the pupil facet mirror 28 are illuminated. In this case, pupil facets 29 of the three outermost pupil facet rings are illuminated here in two connected ring sector regions 31 with a peripheral extent around a centre 32a of the pupil facet mirror 28 of about 55°, in each case.

This dipole illumination of the pupil facet mirror 28 is in turn achieved by corresponding tilting by actuator of the individual mirrors 27 of the field facet mirror 26, as indicated by way of example in FIG. 9 using the example of one of the individual mirrors 27. To adjust the illumination settings in accordance with FIGS. 5, 7 and 9, a tilting angle of the individual mirrors 27 in the range of ±50 mrad is involved. The respective tilting position for the illumination setting to be adjusted has to be maintained with a precision of 0.2 mrad.

The individual mirrors 27 of the field facet mirror 26 or the correspondingly constructed individual mirrors of the field facet mirror 13 and of the pupil facet mirror 14 in the embodiment of the illumination optical system 4 according to FIG. 1 have multi-layer coatings to optimise their reflectivity at the wavelength of the useful radiation 10. The temperature of the multi-layer coatings should not exceed 425 K during operation of the projection exposure system 1.

This is achieved by a structure of the individual mirrors, which (cf. FIG. 11) will be described below by way of example with the aid of one of the individual mirrors 27 of the field facet mirror 26.

Figure 11:
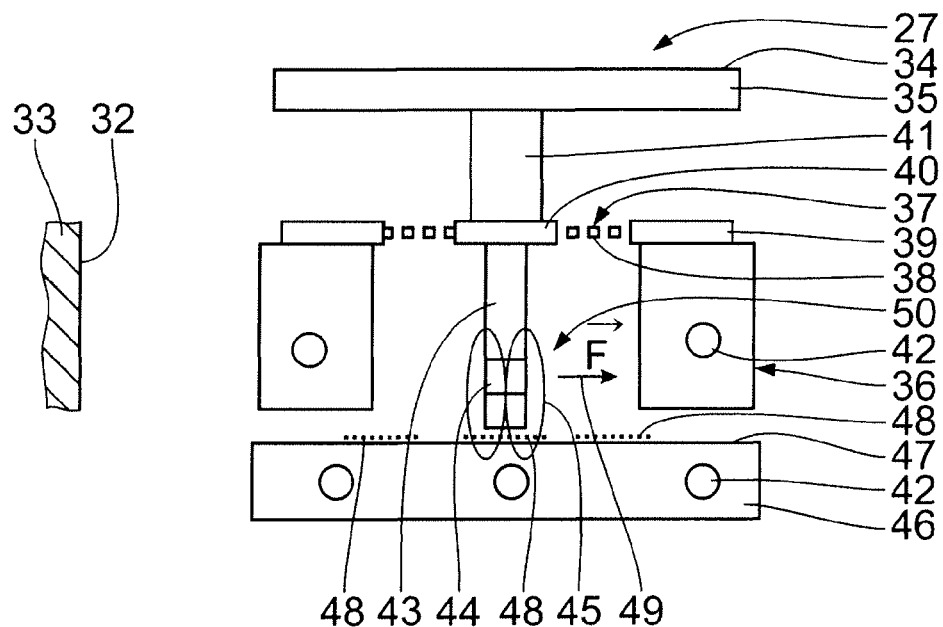
FIG. 11 schematically shows a configuration of an individual mirror of one of the facet mirrors of the illumination optical system according to FIG. 1 and an individual mirror of the multi-mirror array according to FIG. 6 in a sectional side view.

The individual mirrors 27 of the illumination optical system 4 or 24 are accommodated in a chamber 32 which can be evacuated, of which one limiting wall 33 is indicated in FIG. 5 and 11. The chamber 32 communicates by way of a fluid line 33a, in which a check valve 33b is accommodated, with a vacuum pump 33c. The operating pressure in the chamber 32 that can be evacuated is a few Pa (partial pressure $H_2$). All the other partial pressures are clearly below $1 \times 10^{-7}$ mbar.

The mirror having the plurality of individual mirrors 27, together with the chamber 32 that can be evacuated, forms an optical module to guide a beam of the EUV radiation 10. The individual mirror 27 may be part of one of the facet mirrors 13, 14 or 26, 28.

Each of the individual mirrors may have a reflection face 34, which can be impinged on, with dimensions of 0.5 mm×0.5 mm or else 5 mm×5 mm and larger. The reflection face 34 is part of a mirror body 35 of the individual mirror 27. The mirror body 35 carries the multi-layer coating.

The reflection faces 34 of the individual mirrors 27 complement one another to form an overall mirror reflection face of the field facet mirror 26. Accordingly, the reflection faces 34 may also complement one another to form the overall mirror reflection face of the field facet mirror 13 or of the pupil facet mirror 14.

A support structure 36 or a substrate of the individual mirror 27 is mechanically connected by a thermally conductive portion 37 to the mirror body 35 (cf. FIG. 11). Part of the thermally conductive portion 37 is a joint body 38, which allows a tilting of the mirror body 35 relative to the support structure 36. The joint body 38 may be configured as a solid body joint, which allows a tilting of the mirror body 35 about defined tilting degrees of freedom, for example about one or about two tilting axes. The joint body 38 has an outer holding ring 39, which is fixed to the support structure 36. Furthermore, the joint body 38 has an inner holding body 40 connected in an articulate manner to the holding ring 39. The holding body is centrally arranged under the reflection face 34. A spacer 41 is arranged between the central holding body 40 and the mirror body 35.

Heat deposited in the mirror body 35, in other words in particular the fraction of the useful radiation 10 impinging on the individual mirror 27, absorbed in the mirror body 35, is dissipated by the thermally conductive portion 37, namely by the spacer 41, the central holding body 40 and the joint body 38 and the holder 39 to the support structure 36. With the thermally conductive portion 37, a heat power density of 10 kW/m² or a heat power of at least 160 mW can be dissipated to the support structure 36. The thermally conductive portion 37 is alternatively configured to dissipate a heat power density of at least 1 kW/m² or a power absorbed by the mirror body 35 of at least 50 mW to the support structure 36. Apart from absorbed power of the emission of the radiation source 3, the absorbed power may, for example, also be absorbed electric power. The support structure 36 has cooling channels 42, through which an active cooling fluid is guided.

Mounted on the side of the holding body 40 remote from the spacer 41, on the holding body, is an actuator pin 43 continuing the spacer 41 with a smaller external diameter. One free end of the actuator pin 43 carries a permanent magnet 44. A north pole and a south pole of the permanent magnet 44 are arranged next to one another along the actuator pin 43, so a course of magnetic field lines 45 is produced, as indicated in FIG. 11. The support structure 36 is configured as a sleeve surrounding the actuator pin 43. The support structure 36 may, for example, be a silicon wafer, on which a whole array of individual mirrors 27 in the manner of the individual mirror 27 shown in FIG. 11 is arranged.

A cooling plate 46 is arranged on the side of the support structure 26 and the actuator pin 43 remote from the mirror body 35. The cooling plate 46 may be provided continuously for all of the individual mirrors 27 of the field facet mirror 26. Further cooling channels 42, through which the cooling fluid is actively guided, are arranged in the cooling plate 46.

The support structure 36 and the cooling plate 46 ensure an additional radiation cooling of the heat-loaded components of the individual mirror 27, in particular for a radiation cooling of the actuator pin 43.

Conductor paths 48 are printed on a surface 47 of the cooling plate 46 facing the actuator pin 43. The cooling plate 46 is used as a base body for printing on the conductor paths 48. A current flow through the conductor paths 48 transmits a Lorentz force 49 to the permanent magnets 44, for which a force direction is indicated by way of example in FIG. 11. By a corresponding current flow through the conductor paths 48, the actuator pin 43 can therefore be deflected and, correspondingly, the mirror body 35 tilted.

The individual mirror 27 thus has an actuator 50 in the form of an electromagnetically operating actuator, especially in the form of a Lorentz actuator. A Lorentz actuator is basically known, for example, from U.S. Pat. No. 7,145,269 B2. A Lorentz actuator of this type can be produced in a batch process as a microelectromechanical system (MEMS). Using a Lorentz actuator of this type, a force density of 20 kPa can be achieved. The force density is defined as the ratio of the actuator force to the face of the actuator, via which the actuator force acts. The cross section of the actuator pin 43 can be used as a measure of the side face of the actuator to be observed per se, via which the actuator force acts.

As an alternative to the configuration as Lorentz actuators, the individual mirrors 27 can also be configured as reluctance actuators, for example in the manner of WO2007/134574A or as piezo actuators. A force density of 50 kPa can be achieved with a reluctance actuator. Depending on the configuration, a force density of 50 kPa to 1 Mpa can be achieved with a piezo actuator.

Conductor paths 48, which are printed on in the form of three groups located next to one another are shown in the configuration according to FIG. 11. It is alternatively possible to print a plurality of layers lying one above the other of conductor paths insulated from one another on the cooling plate 46, the conductor paths differing with respect to the orientation of the individual conductors on the surface 47 and/or with respect to the cross section of the conductor paths. Depending on the current flow through one of these conductor paths lying one above the other, a different deflection direction can then be produced via the Lorentz force 49.

Figure 12:
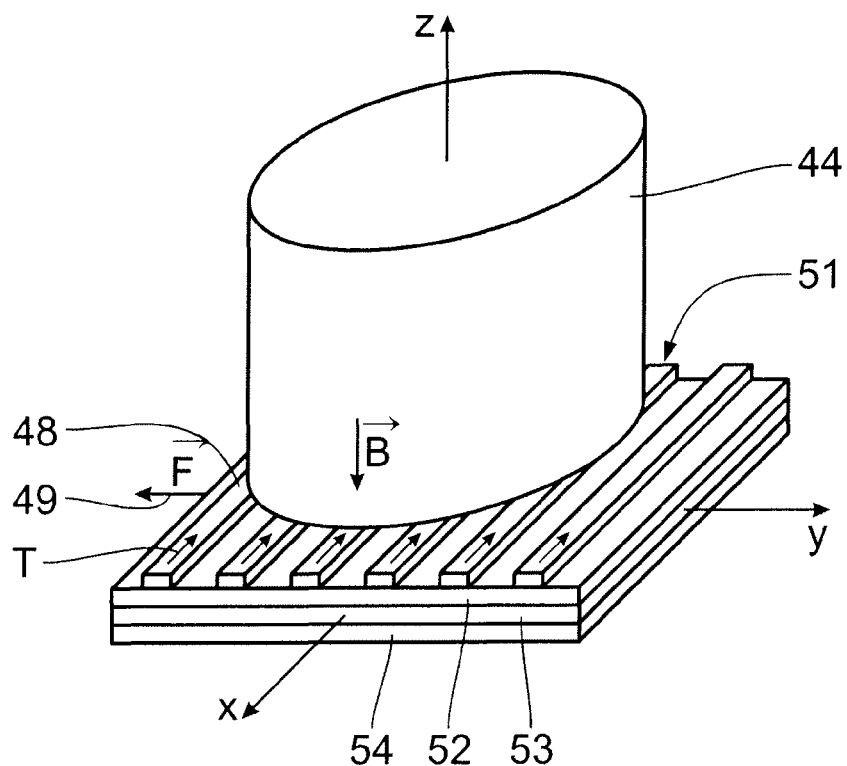
FIG. 12 shows a perspective view of a detail enlargement of the mirror arrangement according to FIG. 11 in the region of a free end of an actuator pin having a permanent magnet.

FIG. 12 shows an arrangement of this type of layers 51 to 54 lying on top of one another, of the conductor paths 48. The uppermost conductor path layer 51 is designed for a current flow in the negative x-direction. Accordingly, the individual conductor paths 48 of the layer 51 run along the x-direction. The conductor paths, not shown in more detail, of the conductor path layers 52, 54 located therebelow run, for example, along an angle bisector to the quadrant spanned by the x- and y-axis, at a 90° angle to this angle bisector and along the y-direction. Owing to a corresponding current flow through the conductor paths oriented in this manner of the layers 52 to 54, a different direction of the Lorentz force 49, in each case, and therefore a different deflection of the permanent magnet 44 and the actuator pin 43, connected therewith and not shown in FIG. 12, is produced. The permanent magnet 44 is part of the actuator pin 43, otherwise not shown in FIG. 12, and therefore of the lever arm of the actuator 50.

Figure 13:
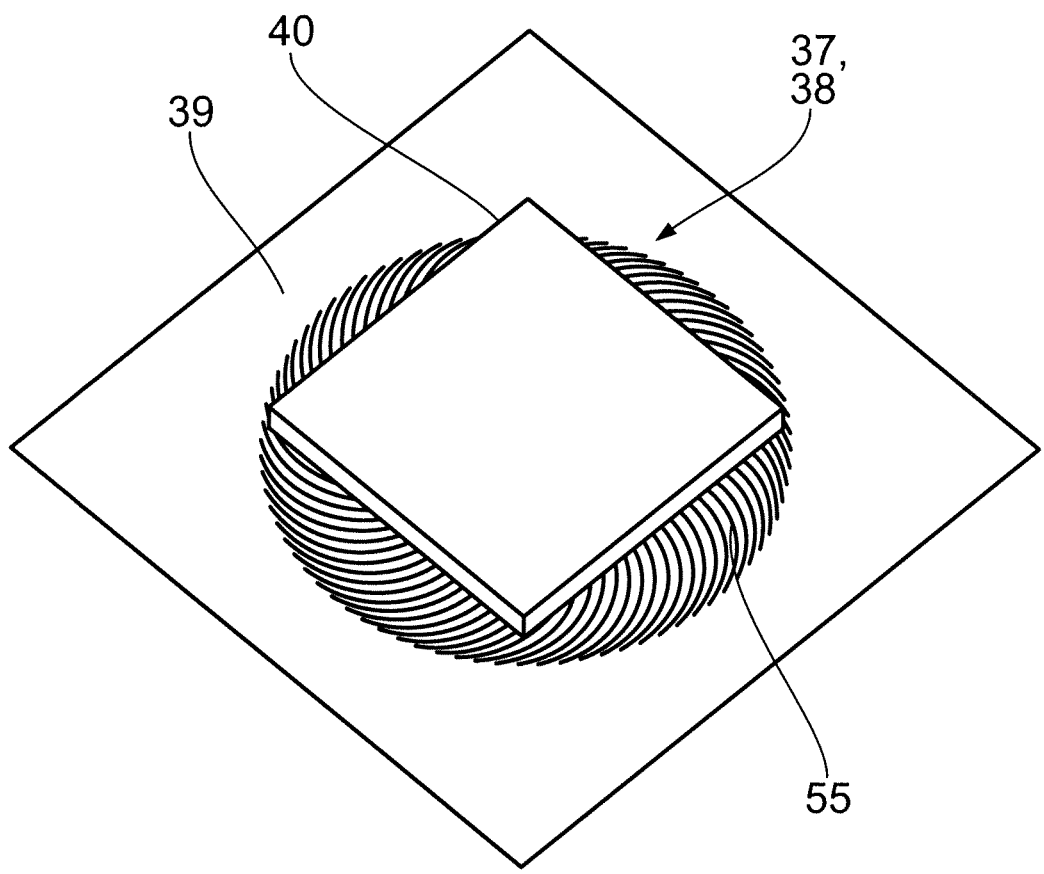
FIG. 13 shows an embodiment of a mounting of an individual mirror according to FIGS. 11 and 12.

FIG. 13 shows a variant of the joint body 38' between the holding ring 39 and the central holding body 40. The joint body 38 has a plurality of adjacent solid body joints 55, which are used as thermally conductive strips and have a strip cross section that is so small that they are elastic and flexible. The solid body joints 55 that are directly adjacent to one another are separated from one another and connect the holding ring 39 to the central holding body 40. In the region of the transition of the solid body joints 55 to the outer holding ring 39, the solid body joints 55 extend approximately tangentially. The solid body joints 55 extend approximately radially in the region of the transition of the solid body joints 55 to the central holding body 40.

The solid body joints 55 have a curved course between the holding ring 39 and the central holding body 40.

Because of this the course of the solid body joints 55, a characteristic rigidity of the joint body 38 formed by these solid body joints 55 is produced in relation to the counter-force, which this joint body 38 uses to counteract the actuator force exerted on the actuator pin 43.

As an alternative to the curved course of the solid body joints 55 shown in FIG. 13, these may also be differently formed and/or have a different course, depending on which the desired rigidity properties are demanded in relation to a rigidity of the joint body 38 in the plane of the holding ring 39 and perpendicular thereto.

The solid body joints 55 overall produce a solid body joint device configured as a slotted membrane. Owing to the strip structuring shown of the membrane, a significantly improved mechanical resilience is achieved in the actuating direction without great losses of heat conductivity, in particular in the thermal power density that can be dissipated. The improved mechanical resilience leads to a reduction in the actuating force for the central holding body 40 and therefore the individual mirror connected therewith.

A sum of the reflection faces 34 on the mirror bodies 35 is greater than 0.5 times an overall face occupied by the overall reflection face of the field facet mirror 26. The overall face is in this case defined as the sum of the reflection faces 34 plus the surface occupation by the intermediate spaces between the reflection faces 34. A ratio of the sum of the reflection faces of the mirror bodies, on the one hand, to this overall face is also called the integration density. This integration density may also be greater than 0.6 and greater than 0.7.

With the aid of the projection exposure system 1, at least a part of the reticle 30 is imaged on a region of a light-sensitive layer on the wafer for the lithographic production of a microstructured or nanostructured component, in particular a semiconductor component, for example a microchip. Depending on the configuration of the projection exposure system 1 as a scanner or as a stepper, the reticle 30 and the wafer are displaced in a time-synchronised manner in the y-direction continuously in scanner operation or step-wise in stepper operation.

The optical module according to FIG. 11 is operated in an ultra-high vacuum. In a typical impingement of the reflection face 34 with EUV radiation 10, the mirror body 35 has a temperature of a maximum of 425 K. Over the spacer 41, this temperature drops to the holding body 40 and to the holding ring 39 by 100 K. Between the holding ring 39 and the cooling channels 42 in the support structure 36 there is a further temperature drop of 30 K. Up to the conductor paths 48, the optical module then substantially has room temperature.

A temperature of about 300 K is present in the cooling plate 46.

A damping of the electromagnetically operating actuator 50 can be realised by an eddy current damping or by a self-induced damping in the conductor paths 48 present as windings. A self-induced damping by the conductor paths 48 assumes the presence of a current or voltage source for the conductor paths 48 with a very low ohmic resistance, so if the conductor paths 48 are without current or voltage, the conductor paths 48 are substantially short-circuited by the source and therefore with a permanent magnet 44 moved relative to the conductor paths 48 (cf. FIG. 11) a damping current flow can be induced in the conductor paths 48.

Supply and removal lines for the conductor paths 48 configured as windings may be guided in an anti-parallel manner, so a supply wire to the respective conductor path 48 configured as a winding, on the one hand, and a removal wire from the conductor path configured as a winding, on the other hand, are guided running adjacent to one another in parallel. This leads to the fact that the magnetic fields of the supply current and removal current eliminate each other so no feedthrough results between adjacent conductor paths 48. The supply or removal lines for the conductor paths 48 configured as windings may be arranged in various layers one above the other or next to one another within a layer.

A further configuration of individual mirrors will be described below with the aid of FIGS. 14 and 15, and will be explained below by way of example with the aid of two individual mirrors 27 of the field facet mirror 26. Components which correspond to those which have already been explained above with reference to FIGS. 1 to 13 and, in particular with reference to FIGS. 11 and 12, have the same reference numerals and will not be discussed again in detail.

Figure 14:
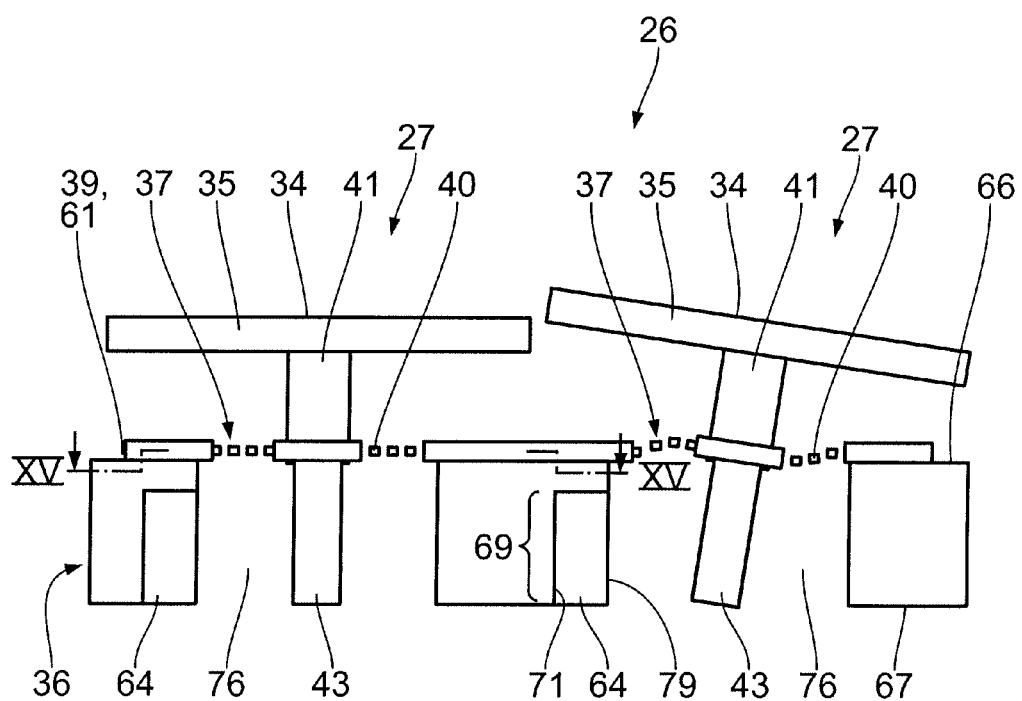
FIG. 14 schematically shows in a view similar to FIG. 11, two adjacent individual mirrors of a further configuration of one of the facet mirrors of the illumination optical system according to FIG. 1 or the multi-mirror array according to FIG. 6 in a sectional side view, the individual mirror shown on the left in FIG. 14 being shown in an untilted neutral position and the individual mirror shown on the right in FIG. 14 being shown in a position tilted by the actuator.
Figure 15:
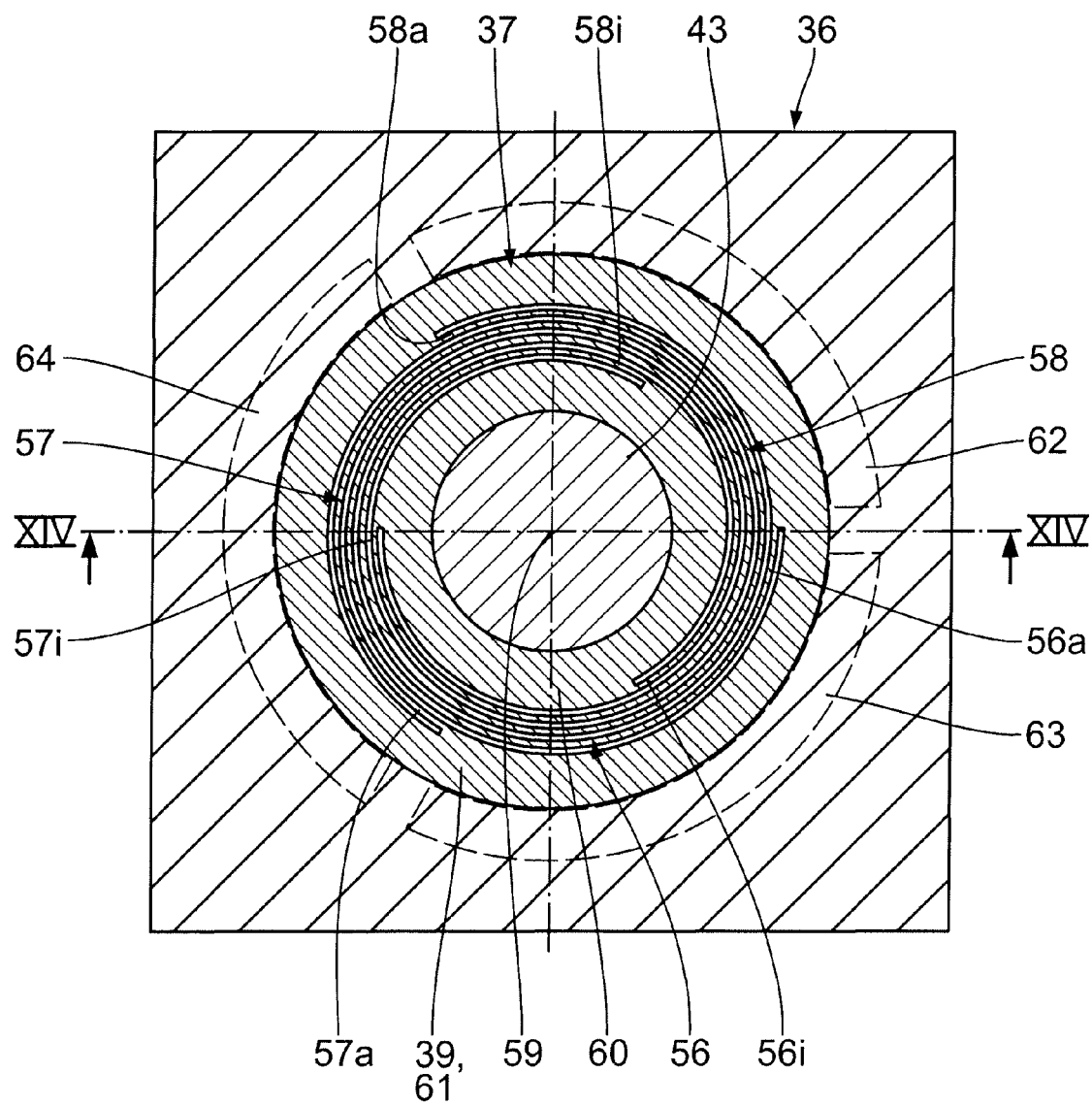
FIG. 15 shows a section along the line XV-XV in FIG. 14.

The configuration of the individual mirrors 27 according to FIGS. 14 and 15 first of all differs from that according to FIGS. 11 to 13 by the design of the thermally conductive portion 37. In the configuration according to FIGS. 14 and 15, this is composed of a total of three spiral thermally conductive strips 56, 57 and 58 and is a slotted membrane. The more detailed structure of the thermally conductive strips 56 to 58 arranged in the manner of three spiral springs nested in one another emerges from the sectional view of FIG. 15. The thermally conductive strips 56 to 58 are guided radially around a centre 59 of the individual mirror 27. In relation to the centre 59 on a radially inner connection portion 60 of the thermally conductive portion 37, according to FIGS. 14 and 15, there is arranged a connection transition 56i, 57i, 58i of the respective thermally conductive strip 56, 57, 58 with the mirror body 35. The radially inner connection portion 60 of the thermally conductive portion 37 is simultaneously the holding body 40. The connection of the respective thermally conductive strip 56 to 58 to the mirror body 35 takes place via the connection transition 56i, 57i, 58i, the central holding body 40 and the spacer 41.

Arranged on the radially outer connection portion 61 is a connection transition 56a, 57a, 58a of the respective thermally conductive strip 56, 57, 58 with the support structure 36. The thermally conductive strips 56 to 58 are connected to the support structure 36 via the connection transitions 56a, 57a, 58a, the outer connection portion 61, which is simultaneously the holding ring 39 and the sleeve of the support structure 36.

The thermally conductive strips 56 to 58 extend separated from one another by intermediate spaces. Each of the thermally conductive strips 56 to 58, independently of the other thermally conductive strips, connects the mirror body 35 to the support structure 36. The support structure 36, as indicated in FIG. 15, may be limited to the outside in a rectangular manner.

The thermally conductive strips 56 to 58 are arranged in such a way that they follow one another on a radius between the inner connection portion 60 and the outer connection portion 61, an intermediate space being present in each case between adjacent thermally conductive strips 56 to 58.

A total of three electrodes 62, 63, 64, which are arranged electrically insulated with respect to one another and extending, in each case, over just 120° in the peripheral direction around the centre 59, are integrated in the sleeve of the support structure 36. The electrodes 62 to 64 are counter-electrodes to the actuator pin 43, formed in the case of a configuration according to FIGS. 14 and 15 as an electrode pin. The actuator pin 43 can be configured as a hollow cylinder. In a further embodiment of the individual mirror 27, four or more electrodes may also be present instead of the three electrodes 62 to 64.

On the right in FIG. 14, the individual mirror 27 in the configuration according to FIGS. 14 and 15 is shown in a tilted position, in which the counter-electrode 64 is connected to a positive potential V+ relative to the negative potential V− of the actuator pin 43. Because of this potential difference V+/V− a force $F_E$ is produced, which draws the free end of the actuator pin 43 toward the counter-electrode 64, which leads to a corresponding tilting of the individual mirror 27. The elastic membrane mounting composed of the three thermally conductive strips 56, 57, 58 in this case ensures a resilient and controlled tilting of the individual mirror 27. In addition, this elastic membrane mounting ensures high rigidity of the individual mirror 27 relative to translatory movements in the membrane plane of the elastic membrane mounting, which is called a high in-plane rigidity. This high degree of rigidity relative to translatory movements in the membrane plane suppresses an undesired translatory movement of the actuator pin 43, in other words of the electrode pin, in the direction of the electrodes 62 to 64, completely or substantially. In this manner, an undesired reduction of a possible tilting angle range of the actuator pin 43 and therefore of the mirror body 35, is avoided.

The thermally conductive strip 56 runs in the peripheral direction around the centre 59 through about 420° between the outer connection portion 56a arranged in FIG. 15 in relation to the centre 59 at the three o'clock position and the inner connection portion 56i arranged in FIG. 15 approximately in the five o'clock position. The thermally conductive strip 57 runs between the outer connection transition 57a and the inner connection transition 57i between the seven o'clock position and the nine o'clock position in FIG. 15, also in the peripheral direction, in the clockwise direction, through about 420°. The thermally conductive strip 58 extends between the outer connection transition 58a and the inner connection transition 58i between the eleven o'clock position and the one o'clock position in FIG. 15, also in the peripheral direction through about 420°.

Depending on how the relative potential of the counter-electrodes 62 to 64 is selected with respect to the potential of the electrode of the actuator pin 43, the individual mirrors 27 of the configuration according to FIGS. 14 and 15 can be tilted by a predetermined tilting angle. In this case, not only are tilting angles possible which corresponds to an incline of the actuator pin 43 precisely to one of the three counter-electrodes 62 to 64, but, depending on a predetermined potential combination of the counter-electrodes 62 to 64, also any other desired tilting angle orientations.

The spacer 41, the actuator pin 43 and the thermally conductive portion 37 with the thermally conductive strips 56 to 58, the inner connection portion 60 and the outer connection portion 61, together with the mirror body 35, are produced from monocrystalline silicon. Alternatively, the thermally conductive strips 56 to 58 including the connection portions 60 to 61 can also be manufactured from polycrystalline diamond via microfabrication.

Instead of an actuator pin 43 with a round cross section, an actuator pin with an elliptical cross section can also be selected. The semiaxes of the ellipse of this cross section are then selected in such a way that a spacing between the electrode of the actuator pin and the counter-electrodes 62 to 64 along a first axis, in which a larger tilting angle range is desired, is smaller than along a second axis which is perpendicular thereto, along which a smaller tilting angle range is desired. The larger tilting angle range may be 100 mrad and the smaller tilting angle range may be 50 mrad.

Figure 16:
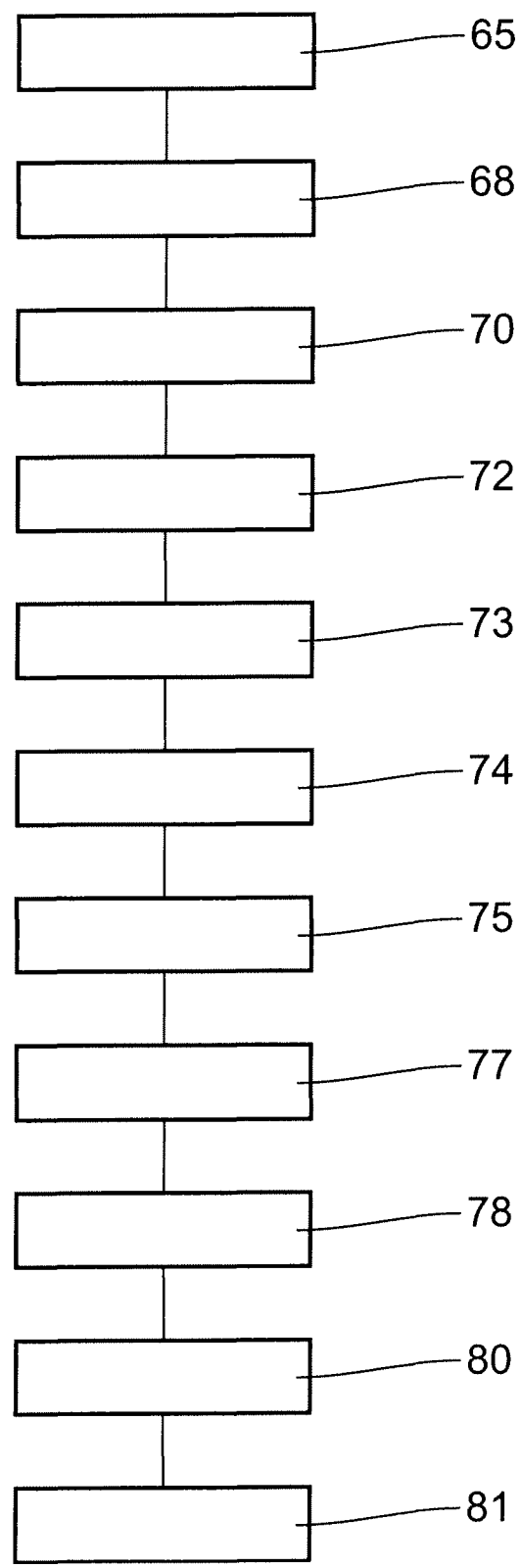
FIG. 16 schematically shows method steps of a method sequence to produce counter-electrodes of an actuator for displacing a mirror body of the individual mirror in the configuration according to FIGS. 14 and 15.

With the aid of FIG. 16, a method for producing the counter-electrodes 62 to 64 will now be described.

In a provision step 65, a starting substrate is provided. This is a monocrystalline silicon wafer, the thickness of which is preferably between 300 µm and 750 µm. The thickness of the silicon wafer may also be below or above this range. The side on which the thermally conductive portion 37 is later applied will be called the front 66 of the starting substrate below. The counter-electrodes 62 to 64 are structured from a substrate rear 67 of the starting substrate opposing the front 66.

In an etching step 68, a base structure is now etched from the substrate rear 67 into the starting substrate, in other words into an unfinished carrier substrate producing the later support structure 36. This may be a ring-shaped or sleeve-shaped support structure 36 according to the configurations according to FIGS. 11 to 15. The support structure 36 etched in the etching step 68 is interrupted at parting points between the counter-electrodes 62 to 64. The etching step 68 takes place with the aid of a standard method such as optical lithography and silicon deep etching. With the etching step 68, the shape of the counter-electrodes 62 to 64 is defined and a negative etched in the manner of a casting form for the counter-electrodes 62 to 64 to be provided later. An etching depth 69 defines the height of the counter-electrodes 62 to 64. This etching depth may be smaller than the thickness of the starting substrate. In a configuration, not shown, the etching depth may also be the same size as the thickness of the starting substrate.

In an application step 70, a dielectric layer is now applied in casting moulds 71, which have been etched in the etching step 68, for electrical insulation of the later counter-electrodes 62 to 64, to the starting substrate. The dielectric layer may be silicon dioxide. The application may take place by a standard method such as thermal oxidation or CVD (Chemical Vapour Deposition). The thickness of the dielectric layer is several micrometers. The dielectric layer may be configured as a layer of doped silicon oxide, whereby a preparation for a later doping of the counter-electrodes 62 to 64 can take place.

In a filling step 72, the casting mould 71 lined with dielectric layer is filled with polycrystalline silicon. An LPCVD (Low Pressure CVD) method may be used here. The polycrystalline silicon is doped and electrically conductive. A doping of the polycrystalline silicon can take place directly during the application, or subsequently, by diffusion.

In a polishing step 73, which can be realised by a CMP (Chemical Mechanical Polishing) method, excess polycrystalline silicon, which has grown during the filling step 72 outside the casting moulds 71 on the casting substrate, is polished away.

In a structuring step 74, the thermally conductive portion 37 is now applied to the starting substrate on the front 66 of the starting substrate. This may be realised with the aid of a thin layer method. As described above, the thermally conductive portion 37 connects the actuator pin 43, in the configuration according to FIGS. 14 and 1, in other words the central electrode, to the support structure 36. A polycrystalline diamond layer may be used as the thin layer. The polycrystalline diamond layer may be applied with the aid of a CVD method. The structuring step 74 is not imperative for the counter-electrode production method, but is used to prepare the application of the moveable central electrode.

In an application step 75, the mirror body 35 is applied from the front 66. This takes place in such a way that the respective mirror bodies 35, after their separation are connected in each case in the central region, in other words in the region of the later central spacer 41, to the starting substrate. The application step 75 can be designed as a fusion-bond process.

In a further structuring step 77, from the rear of the starting substrate, the central and preferably moveable electrode, in other words the actuator pin 43, is structured with the aid of optical lithography and deep etching methods. This takes place by etching free an intermediate space 76 between the central electrode, in other words the actuator pin 43, and the sleeve of the support structure 36. The starting substrate is thus completely etched through. The central electrode is then only still connected by the thermally conductive portion 37, in other words by the spring attachment previously applied to the front 66, to the starting substrate. The oxide layer, which was applied in the application step 70, acts during this further structuring step 77 as a side etching stop and protects the elements made of polycrystalline silicon prepared in the filling step 72 for the counter-electrodes 62 to 64.

In an exposure step 78, the exposed oxide layer on an inside 79 of the counter-electrodes 62 to 64 is now etched away. This exposure step 78 may also be omitted.

The micro-mirror actuator prepared in this manner may be electrically and mechanically attached to a further substrate in an attachment step 80. This can take place via a flipchart method, with which the electrode arrangements produced are bonded on an integrated circuit (ASIC). This takes place from the substrate rear 67. In this case, the counter-electrodes 62 to 64 are electrically connected to corresponding circuits on the integrated circuit. A configuration of this type allows an integrated activation of the counter-electrodes 62 to 64 and therefore a corresponding control of the tilting mirrors of the respective individual mirror 27.

The counter-electrodes 62 to 64 produced by this method are integrated in the support structure 36 in the starting substrate, but are not mechanically separated from the starting substrate. The support structure 36 is therefore also, after the integration of the counter-electrodes 62 to 64, a monolithic unit, which ensures sufficient stability for further process steps, in particular for the connection in the attachment step 80.

During the attachment step 80, the counter-electrodes 62 to 64 can be contacted directly from the rear 67 by the flipchart method in a contacting step 81, in other words, from a direction extending in FIG. 14 vertically and perpendicular to the reflection face 34 in the neutral position. A contact from a direction extending horizontally, for example, in FIG. 14, is not necessary.

Figure 17:
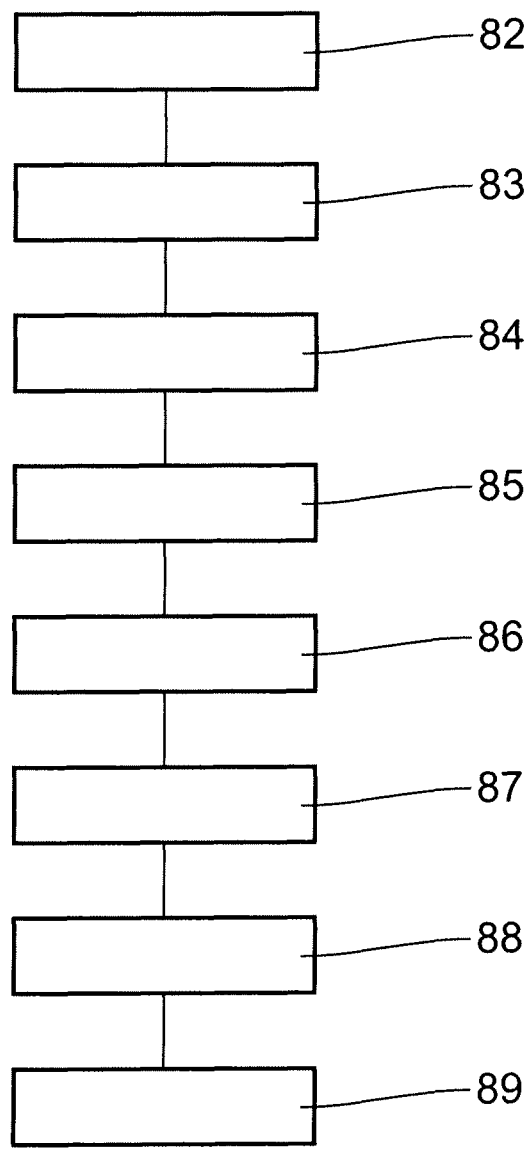
FIG. 17 schematically shows a method sequence of a method for integrating a mirror body with a mirror face with a low degree of roughness in an individual mirror of the configuration according to FIGS. 14 and 15.

With the aid of FIG. 17, a method for the integration of a mirror body 35 with a reflection face 34 with extremely low roughness will be described below.

The desired properties of the surface composition of the reflection face 34, in particular of the micro roughness thereof, are very high. A typical value for this is a roughness of 0.2 nm rms. This micro roughness value involves an external polishing of the reflection face 34, which is connected, after the polishing, to the other individual mirror 27. During the production method described below, the pre-polished and highly sensitive reflection face 34 is preserved during all the process steps applied in a typical microfabrication method.

In a polishing step 82, a silicon substrate with a format suitable for microfabrication, for example a round substrate with a diameter of 100 mm or 150 mm, and a thickness for the polishing process, for example a thickness of 10 mm, is polished for the surface roughness for the EUV illumination.

Polishing methods of this type are also called "super polishing". In a coating step 83, the polished silicon substrate is covered by a thermal method with a thin silicon dioxide layer.

In a joining step 84, the oxidised, super polished silicon substrate is joined together with a second silicon substrate of the same format which has not been super polished. In this case, the super polished reflection face 34 comes to rest on the second silicon substrate, which is also called a carrier substrate. In the joining step 84, a fusion bonding may be used, which is used in conjunction with the production so-called "silicon-on-insulator" (SOI) wafers.

In a further polishing step 85, the substrate sandwich thus produced is polished with the aid of a chemical-mechanical method. The future mirror substrate is thus ground to the desired thickness. A typical thickness of the mirror body 35 is in the range between 30 μm and 200 μm.

The substrate now brought to the desired thickness can now be further processed as the highly polished and sensitive reflection face 34 is mechanically and chemically protected by the silicon dioxide layer located thereabove and the silicon carrier substrate.

In a structuring step 86, a rear of the mirror substrate opposing the reflection face 34 is now structured via a deep etching method. The spacer 41 can thus be etched, which is later connected with the thermally conductive portion 37, in other words with the spring mounting, which is also called a membrane suspension. In the structuring step 86, lateral mirror limits of the reflection face 34 can also be predetermined by deep etching, so that during a later removal of the carrier substrate, the mirror bodies 35 of the individual mirrors 27 are already separated.

The substrate sandwich thus prepared is now connected in a connection step 87 to the central electrode, in other words to the actuator pin 43. This takes place in the application step 75 of the production method according to FIG. 16. The connection step 87 can be configured as fusion bonding or as eutectic bonding. The spacer 41 can be connected here to the actuator pin 43.

In an exposure step 88, the carrier substrate, which hitherto has protected the reflection face 34, is etched away with a deep etching method. The etching process stops here on the silicon dioxide layer, which is applied to the reflection face 34.

In a further exposure step 89, the silicon dioxide layer is etched away, for example by hydrofluoric acid in the vapour phase. This further exposure step 89 may take place in a non-oxidising atmosphere in order to prevent reoxidation of the silicon of the reflection face 34.

The coating step 83 may also be omitted. Instead of a coating with a thin silicon dioxide layer, a plurality of indentations can be etched into the carrier substrate by a deep etching method. These indentations are dimensioned and arranged such that when joining the carrier substrate to the prepolished mirror body 35, the future reflection faces 34 do not come into contact with the carrier substrate. A contact face between the mirror substrate and the carrier substrate is then exclusively predetermined by the course of the frame faces of the carrier substrate surrounding the indentations. These frame faces correspond to later mirror limits of the individual mirrors 27. Before joining the carrier substrate to the mirror substrate, the prestructured carrier substrate, in other words the carrier substrate having the indentations, is thermally oxidised. The silicon dioxide layer thus applied is used as an etching stop during the later etching away of the carrier substrate. This variant without the coating step 83 can also be used in individual mirrors 27 with non-level reflection faces 34, for example in individual mirrors 27 with concave or convex reflection faces 34.

To illustrate the configuration of the thermally conductive strips 56 to 58, FIG. 18 again shows a region of the thermally conductive portion 37. The central holding body 40, which is also the inner connection portion 60, and the thermally conductive strips 56 to 58 surrounding the latter are shown.

Figure 18:
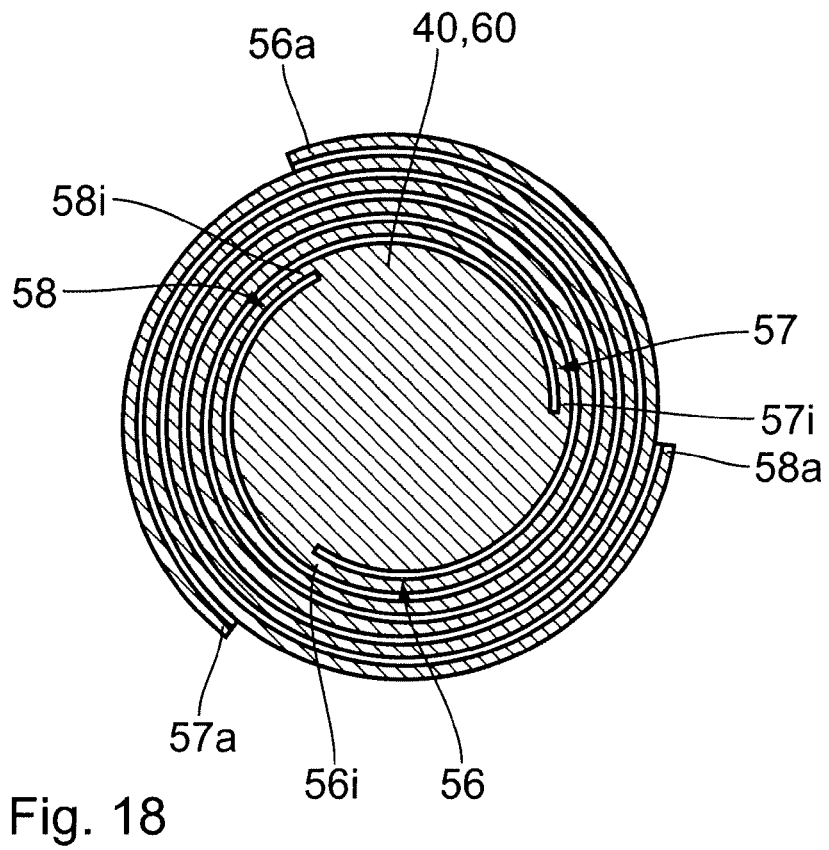
FIG. 18 in a view similar to FIG. 15, shows, in regions, a thermally conductive portion of the configuration of the individual mirror according to FIGS. 14 and 15.
Figure 19:
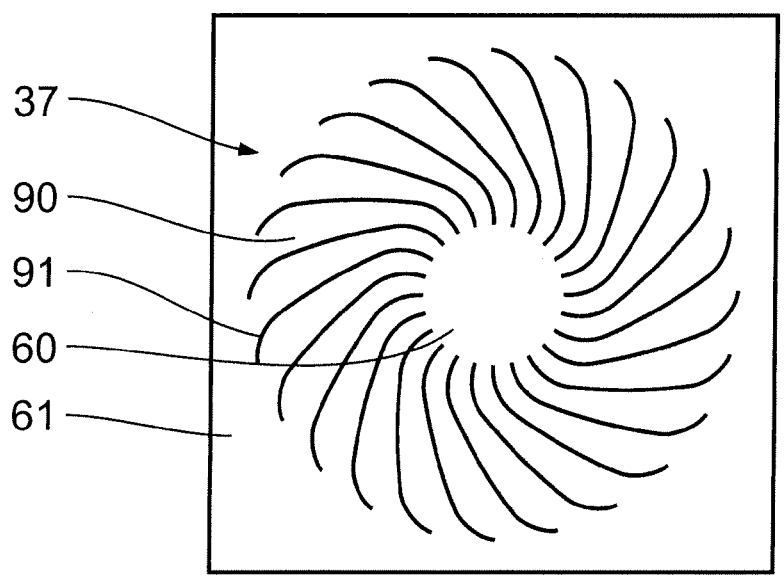
FIG. 19 shows, in a view similar to FIG. 18, a further configuration of thermally conductive strips within a thermally conductive portion.

FIG. 19 shows a variant of the design of thermally conductive strips 90 for the thermally conductive portion 37 between the support structure, not shown, and the mirror body not shown. Components, which correspond to those which have already been described above with reference, in particular, to the design of the thermally conductive portion of the individual mirror according to FIGS. 14, 15 and 18, have the same reference numerals and will not be discussed again in detail.

Between the inner connection portion 60 and the outer connection portion 61, 24 thermally conductive strips 90 bent in a C-shape are present. Adjacent thermally conductive strips 90 are spaced apart from one another by slots 91 also in a C-shape. As in the configuration according to FIGS. 15 and 18, in the configuration according to FIG. 19, the thermally conductive portion 37 is also present as a membrane, in which the thermally conductive strips, in other words in the case of the configuration according to FIG. 19, the thermally conductive strips 90, are formed by incorporation of the slots 91.

Two further design possibilities for the thermally conductive portion 37 will be described below with the aid of FIGS. 20 and 21. Components, which correspond to those which have already been described above with reference, in particular, to the design of the thermally conductive portion of the individual mirror according to FIGS. 14, 15 and 18, have the same reference numerals and will not be discussed again in detail.

Figure 20:
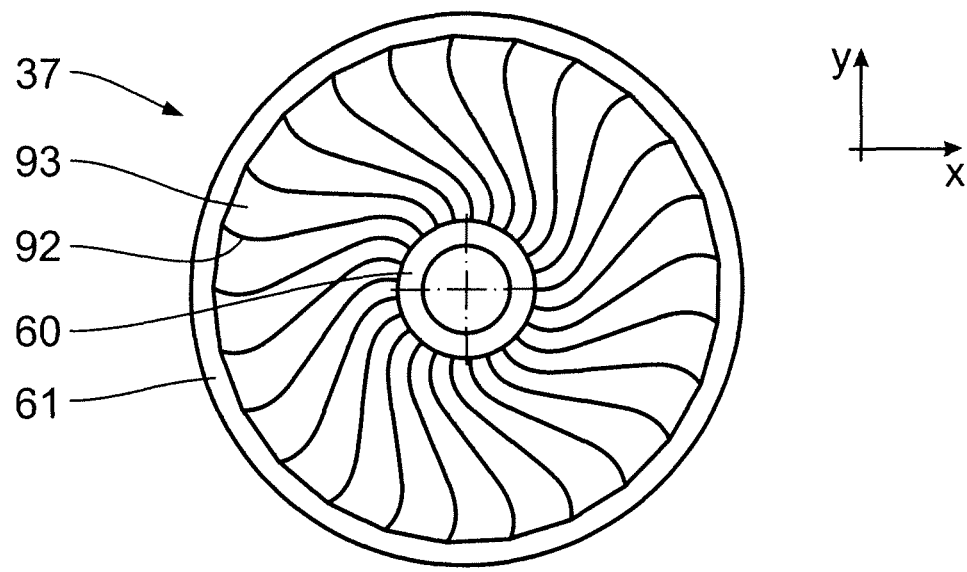
FIG. 20 shows, in a view similar to FIG. 18, a further configuration of thermally conductive strips within a thermally conductive portion.

In the configuration according to FIG. 20, present between the inner connection portion 60 and the outer connection portion 61 are a total of 25 thermally conductive strips 92, which are arranged substantially radially in the manner of spokes of a wheel. Between the inner connection portion 60 and the outer connection portion 61, each of the thermally conductive strips 92 is curved in an S-shape. Adjacent thermally conducive strips 92 are separated from one another by slots 93.

Figure 21:
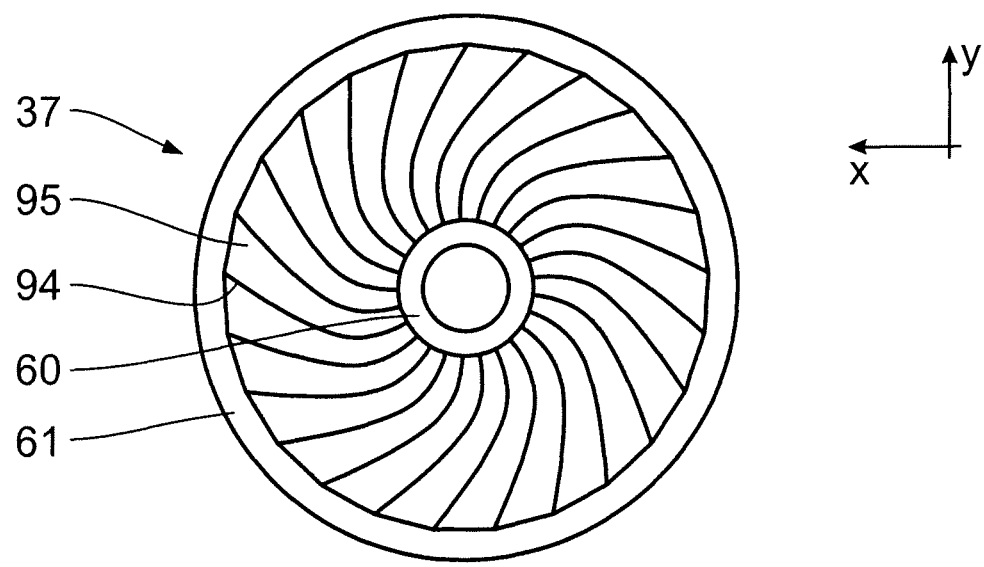
FIG. 21 shows, in a view similar to FIG. 18, a further configuration of thermally conductive strips within a thermally conductive portion.

The configuration according to FIG. 21 differs from that according to FIG. 20 by the shape of the bend of the thermally conductive strips, which in the configuration according to FIG. 21, have the reference numeral 94. In the configuration according to FIG. 21, the thermally conductive strips 94 are also bent in a C-shape in the plane of the thermally conductive portion 37. Adjacent thermally conductive strips 94 are also spaced apart by slots 95 also bent in a C-shape.

Owing to the configuration of the thermally conductive strips in accordance with the above-described embodiments of the individual mirror according to FIGS. 14, 15 and 18, according to FIG. 20 and according to FIG. 21 and owing to the design of the slots arranged between adjacent thermally conductive strips with regard to the shape, the width, the number of thermally conductive strips and the shape, width and number of slots, a rigidity and a thermal conduction property of the membrane spring configured thereby in each case between the inner connection portion 60 and the outer connection portions 61 can be adapted to predetermined values.

Two different design possibilities in the thermal coupling of the spacer 41 to the central holding body 40 or the inner connection portion 60 of the thermally conductive portion 37 will be described with the aid of FIGS. 22 and 23. Components, which correspond to those which have already been described above with reference, in particular to FIG. 14, have the same reference numerals and will not be discussed again in detail.

Figure 22:
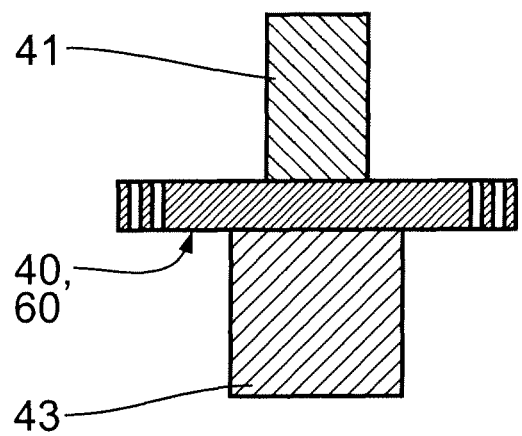

In the configuration according to FIG. 22, the central holding body 40 of the thermally conductive portion 37 is arranged between the spacer 41 and the actuator pin 43, so the spacer 41 is attached on one side of the central holding body 40 of the thermally conductive portion 37 and the actuator pin 43 is attached to the other side of the central holding body 40. The spacer 41 is thus connected to the actuator pin 43 by the holding body 40.

Figure 23:
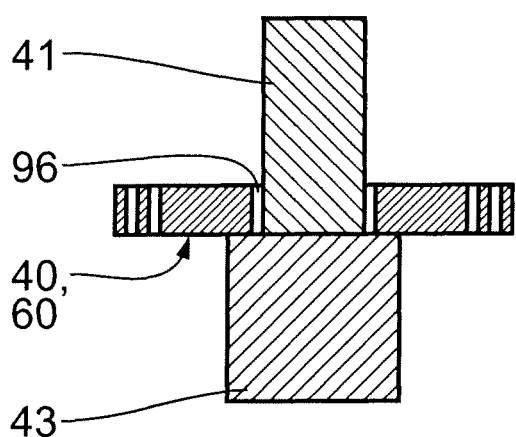
FIG. 23 shows, in a view similar to FIG. 22, a further configuration of a connection of the spacer to the actuator pin and the thermally conductive portion.

In the configuration according to FIG. 23, the spacer 41 is directly connected to the actuator pin 43. The central holding body 40 of the thermally conductive portion 37 has a central opening 96, through which an end of the spacer 41 facing the actuator pin 43 extends. The central holding body 40, which surrounds this end region of the spacer 41 rests on an end wall of the actuator pin 43 facing the spacer 41 and is connected thereby to the actuator pin 43. A thermal coupling of the spacer 41 and therefore of the mirror body 35 on the thermally conductive portion 37 does not take place directly in the configuration according to FIG. 23, but via the actuator pin 43.

Figure 24:
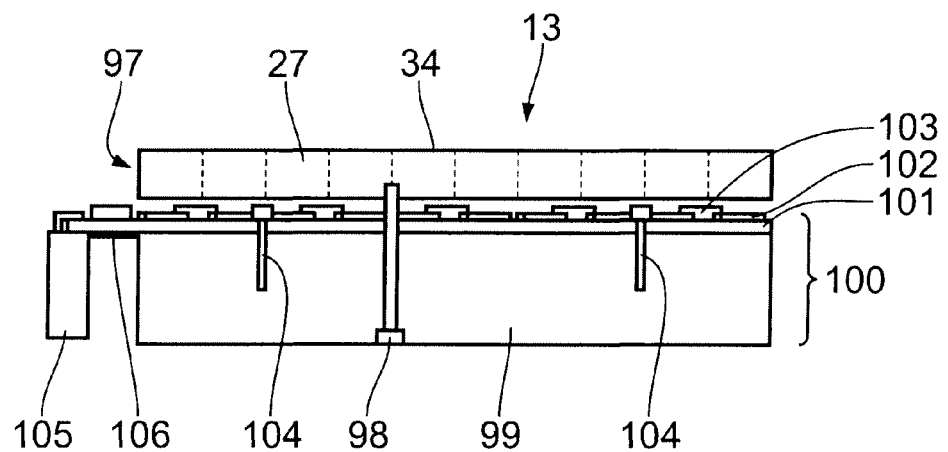
FIG. 24 schematically shows a cross section through an embodiment of an optical module perpendicular to the reflection faces of the individual mirrors, an activation circuit board to activate the actuators of the individual mirrors being shown in addition to a schematically shown mirror plate with an array arrangement of the individual mirrors.

FIG. 24, using the example of the field facet mirror 13, schematically shows the optical module with individual mirrors arranged line-wise and column-wise, in other words in the manner of an array, in the cross section perpendicular to an overall mirror reflection face, for the formation of which the reflection faces 34 of the individual mirrors complement one another. Components and functions, which correspond to those which have already been described above with reference to FIGS. 1 to 23, have the same reference numerals and will not be discussed again in detail.

The individual mirrors 27 arranged in the manner of an array are combined schematically in FIG. 24 to form a mirror plate 97. With thermally conductive mirror plate fixing pins 98, of which only one is shown in FIG. 24, the mirror plate 97 is fixed to a ceramic carrier 99, which simultaneously has the function of a heat sink, into which heat introduced, for example, by residual absorption or by electric power is guided away from the mirror plate 97.

The ceramic carrier 99 is part of a displacement activation circuit board 100, which is arranged on the side of the mirror plate 97 opposing the reflection faces 34, in other words the individual mirror 27. A layer of a ceramic substrate 101 is firstly applied on the heat sink 99 of the activation circuit board 100 on the side facing the mirror plate 97. The ceramic substrate 101 can alternatively also be manufactured from a silicon material.

The ceramic substrate 101 in turn carries coil plates 102 and integrated electronic displacement circuits (ASICs) 103. One of the ASICs 103 is spatially associated with each of the displaceable individual mirrors 27 of the field facet mirror 13. Each ASIC 103 is associated here with a group of individual mirrors 27, namely, in each case, precisely four individual mirrors 27, as will be described below. The ceramic substrate 101 is fastened to the heat sink 99 by a plurality of elastic substrate fixing pins 104.

Using a connection clamp 105, the activation circuit board 100 is connected to a central control device, which is not shown in FIG. 24. An earth line 106 of the activation circuit board 100 is also connected to the connection clamp 105.

FIG. 25 again shows the structure of the field facet mirror 13 with the mirror plate 97 and the activation circuit board 100 in a different view, in which the mirror plate 97 is shown in more detail and the activation circuit board 100 is shown more schematically.

Figure 25:
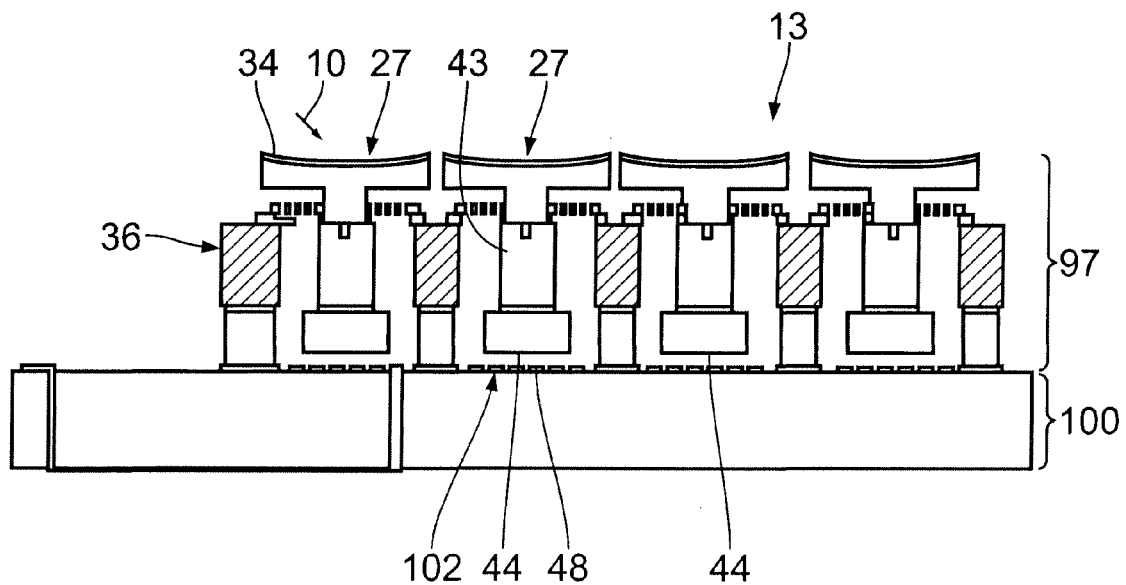
FIG. 25 shows, in a view similar to FIG. 14, a further configuration of a plurality of individual mirrors lying next to one another of the optical module, with the activation circuit board, which is arranged on the side opposing the reflection faces of the individual mirrors, being schematically shown below support structures of the individual mirrors.

The structure of the individual mirrors 27, apart from differences in detail, corresponds to the structure of the individual mirrors, which have already been described above in conjunction with FIGS. 11 and 14. The permanent magnet 44 at the end of the actuator pin 43 in the individual mirrors 27 according to FIG. 25, is configured as a samarium cobalt magnet. Portions of the support structure 36 adjacent to the activation circuit board 100 are configured unhatched. These unhatched portions, on the one hand, have a thermal conduction function and, on the other hand, are used as a support frame for the individual mirrors 27.

A group of conductor paths 48 or coils of a coil plate 102 are in each case arranged associated with and facing one of the permanent magnets 44 on the activation circuit board 100.

It is schematically shown in FIG. 25 that the reflection faces 34 of the individual mirrors 27 have a high-reflective coating for the useful radiation 10.

Figure 26:
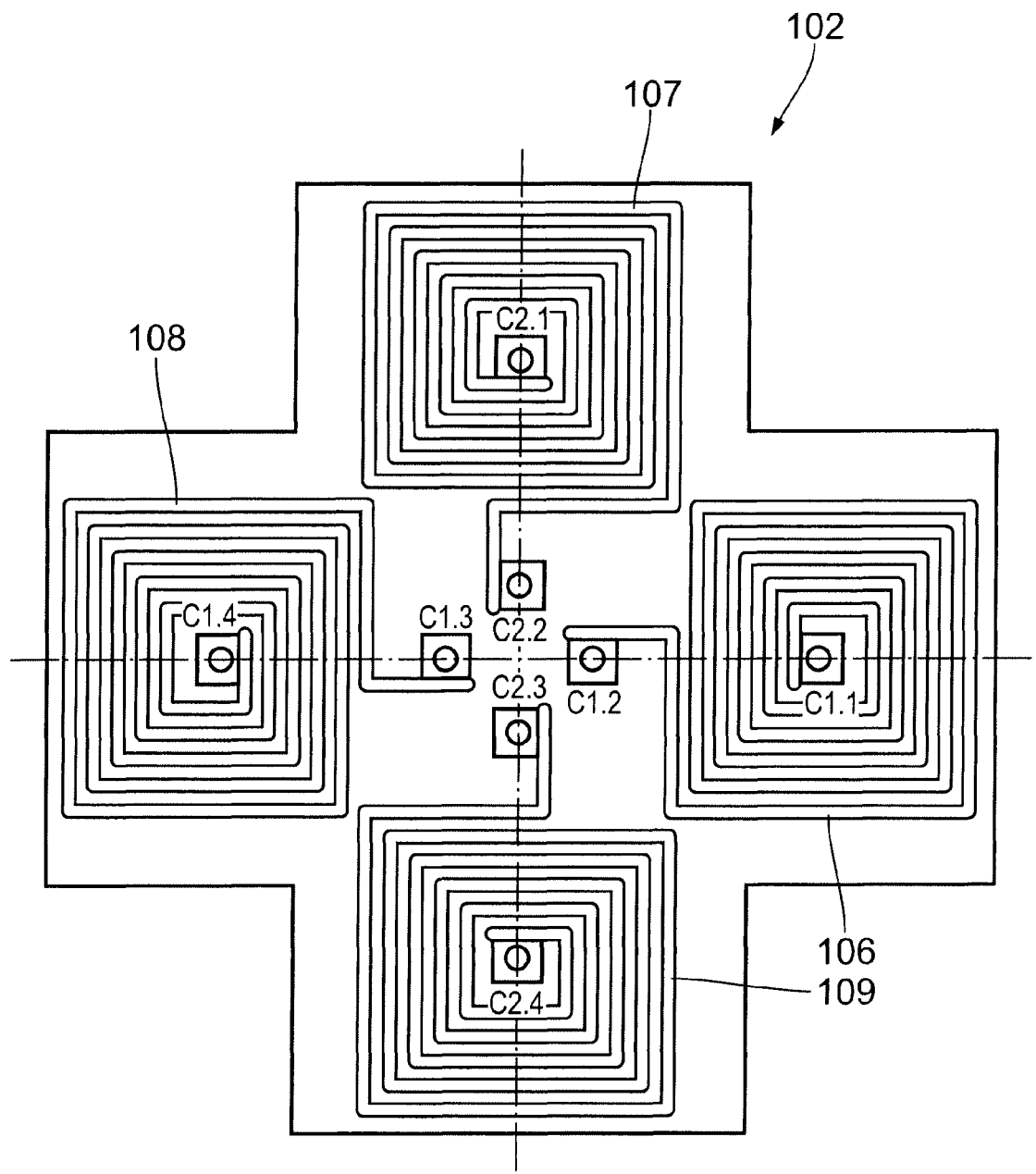
FIG. 26 shows a plan view of conductor paths to configure an actuator configured as a Lorentz actuator of one of the individual mirrors, the conductor paths being applied to the activation circuit board in the form of a coil plate with a total of four individual coils, which are activated pair-wise.

In a plan view, FIG. 26 shows the more detailed structure of one of the coil plates 102. In the plan view according to FIG. 26, the coil plate 102 is symmetrically cruciform in fours and has a total of four individual coils 106, 107, 108, 109 which are arranged in a square-spiral shape as conductor paths for the Lorentz actuator system and are numbered consecutively in FIG. 26 beginning with the individual coil 106 shown on the right there, in the anticlockwise direction. The actuators, the displacement movement of which is produced by the interaction of permanent magnets 44 with the individual coils 106 to 109 of one of the respective coil plates 102, are configured as Lorentz actuators. Each of the individual coils 106 to 109 has an electrical central contact. The central contact is designated C1.1 in the individual coil 106, C2.1 in the individual coil 107, C1.4 in the individual coil 108 and C2.4 in the individual coil 109. Each of the individual coils 106 to 109 also has, at the outer spiral end, a lateral electric contact arranged toward the centre of the coil plate 102. The lateral electric contact of the individual coil 106 is designated C1.2, the lateral electric contact of the individual coil 107 is designated C2.2, the lateral electric contact of the individual coil 108 is designated C1.3 and the lateral electric contact of the individual coil 109 is designated C2.3.

In the plan view according to FIG. 26, the coil plate 102 can be inscribed in a square with a side length of a few mm, for example with a typical side length of 5 mm.

The coil plates 102 can be mounted and contacted with the aid of a flip-chip technique. A description of this technique is found in the book "Baugruppentechnologie der Elektronik-Montage" (publisher: Wolfgang Scheel), $2^{nd}$ edition, Verlag Technik, Berlin, 1999). Details of the flip-chip technique are disclosed in a prospectus "Flipchiptechnologie" of HMT Microelectronic AG, Biel, Switzerland, callable under the link http://www.hmt.ch/techdetail.jsp?ID_Page=10000H_10000F&ID_Group=100001 and from Rao Tummala, "FUNDAMENTALS OF MICROSYSTEMS PACKAGING", McGraw-Hill, 2001, ISBN 0-07-137169-9.

Figure 34:
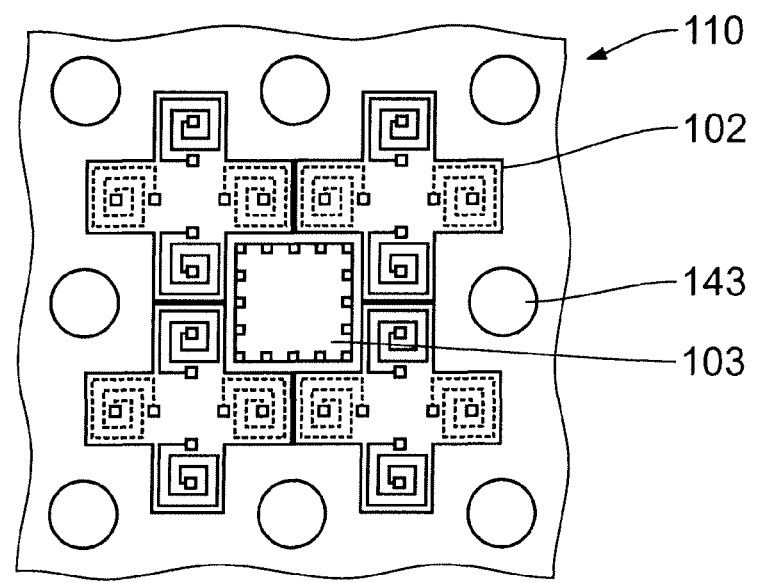
FIG. 34 shows, in view similar to FIG. 31, the coil plate group with an installed integrated electronic displacement circuit (ASIC) in a plan view of the activation circuit board.

FIG. 34 schematically shows the special arrangement of an ASIC 103 with respect to the group 110 associated with it of four coil plates 102. Associated with each ASIC 103 is a group of four individual mirrors 27, to which the four coil plates 102 belong. The four coil plates 102 of the group 110, in the plan view of FIG. 34, delimit a free installation space in the form of a square, in which the ASIC 103 is arranged.

Figure 27:
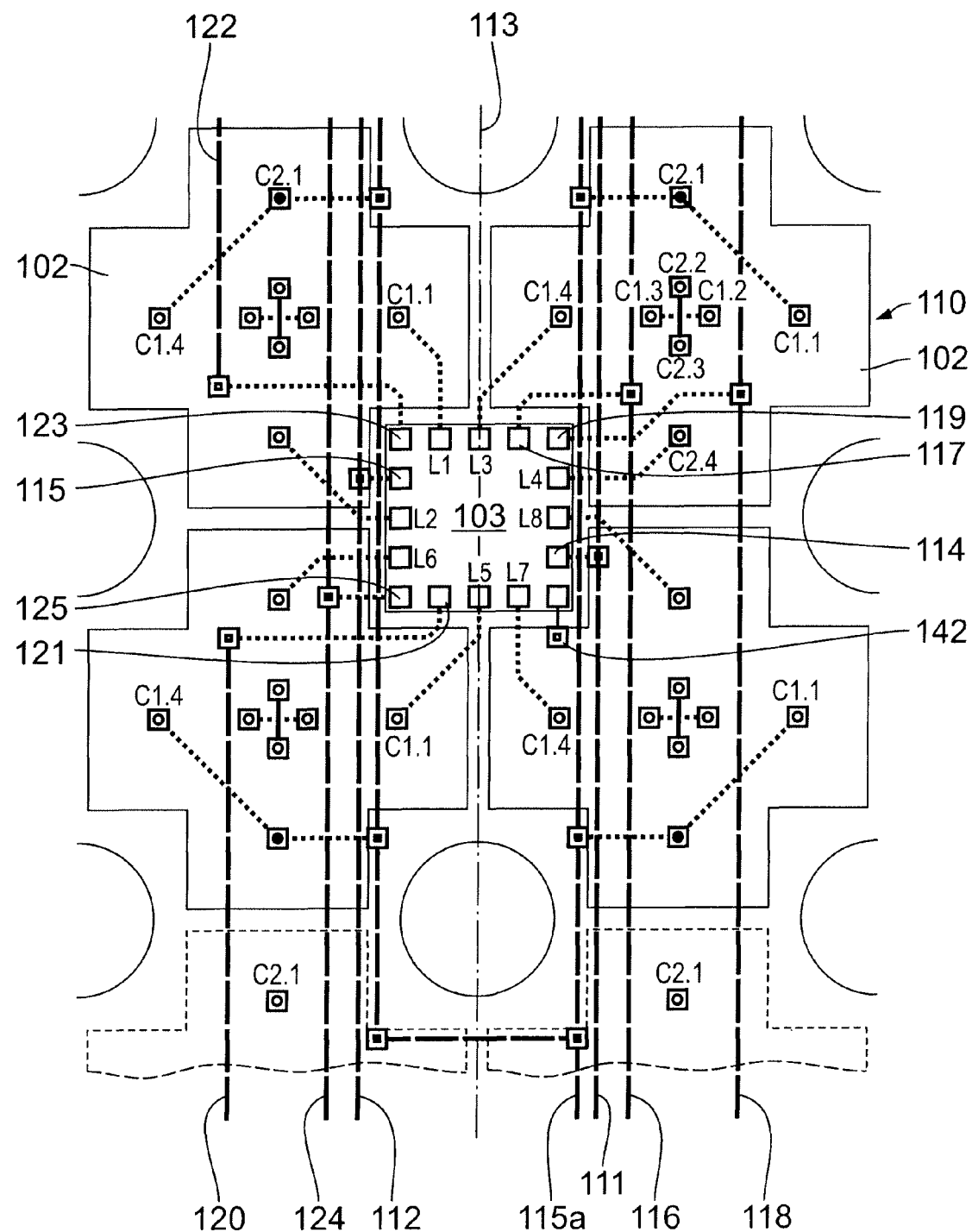
FIG. 27 schematically shows an interconnection of an integrated electronic displacement circuit (ASIC) with four associated coil plates as part of an individual mirror column to be activated of an individual mirror array.

FIG. 27 shows the electric interconnection of the ASIC 103 and the group 110 of coil plates 102 associated with it. The respective individual coils 106 to 109 of the coil plates 102 of the group 110 are activated by two main control lines 111 and 112. The course of the main control lines 111 and 112 predetermines a column direction of the array of individual mirrors 27. Applied to the main control line 111, which runs parallel to a mirror column of the mirror plate 97, is a voltage of −1V relative to an earth potential. In relation to a column centre plane 113, which is simultaneously a mirror plane of symmetry and runs perpendicular to the plane of the drawing in FIG. 27, the main control line 112 is arranged mirror-symmetrically with respect to the main control line 111. A control voltage of +1V relative to the earth potential is applied at the main control line 112. The activation via the main control lines 111, 112 thus takes place via a protective extra-low voltage.

The main activation line 111 is connected by a contact pin 114 to the ASIC 103. The main control line 112 is connected by a contact pin 115 to the ASIC 103. The ASIC 103 is in each case connected by contact pins L1 to L8 to one of the contact pins of two individual coils of the coil plates 102 of the group 110. The contact pin L1 is connected to the contact pin C1.1 of the individual coil 106 of the coil plate 102 shown at the top left of FIG. 27. The contact pin L2 is connected to the contact pin C2.4 of the individual coil 109 of the same coil plate 102. The contact pin L3 is connected to the contact pin C1.4 of the individual coil 108 of the coil plate 102 shown at the top right of FIG. 27. The contact pin L4 is connected to the contact pin C2.4 of the individual coil 109 of the same coil plate 102. The contact pin L5 is connected to the contact pin C1.1 of the individual coil 106 of the coil plate 102 shown at the bottom left in FIG. 27. The contact pin L6 is connected to the contact pin C2.1 of the individual coil 107 of the same coil plate 102. The contact pin L7 is connected to the contact pin C1.4 of the individual coil 108 of the coil plate 102 shown at the bottom right in FIG. 27. The contact pin L8 is connected to the contact pin C2.1 of the individual coil 107 of the same coil plate.

The contact pins C1.2 of the individual coils 106 and C1.3 of the individual coils 108 of the respective same coil plate 102 are directly connected to one another. The individual coils 106, 108 therefore form a pair of individual coils. Correspondingly, the contact pins C2.3 of the individual coils 109 and C2.2 of the individual coils 107 of the respective same coil plate 102 are directly connected to one another. The individual coils 107, 109 therefore form a pair of individual coils.

The respective individual coil pairs 106, 108, which are arranged transverse to the column direction, can therefore be activated by the activation contact pins L1, L3, L5 and L7. The individual coil pairs 107, 109, which are arranged parallel to the column direction, can be activated by the activation contact pins L2, L4, L6 and L8.

Portions of an earth line 115 also running along the column direction are in each case arranged adjacent to the main control lines 111, 112. With corresponding contact points, these portions of the earth line 115 are connected to the contact pins C1.1 of the individual coils 106 of the two base plates 102 arranged on the right in FIG. 27, to the contact pin C2.1 of the individual coil 107 of the base plate 102 arranged at the top right in FIG. 27 and to the contact pin C2.4 of the individual coil 109 of the base plate 102 arranged at the bottom right in FIG. 27. With further contact points, these portions of the earth line 115 are connected to the contact pins C1.4 of the individual coils 108 of the two base plates 102 arranged on the left in FIG. 27, with the contact pin C2.1 of the individual coil 107 of the base plate 102 arranged at the top left in FIG. 27 and with the contact pin C2.4 of the individual coil 109 of the base plate 102 arranged at the bottom left in FIG. 27.

An overall approximately mirror-symmetrical activation of the individual coils 106 to 109 of the group 110 of coil plates 102 associated with the ASIC 103 in relation to the mirror plane of symmetry 113 is produced.

Arranged adjacent to the main control line 111 is a reset line 116 also running in the column direction, which is connected by a contact pin 117 to the ASIC 103. A serial clock generator line 118, which is connected by a contact pin 119 to the ASIC 103, runs parallel to the reset line 116. Running adjacent to the main control line 112, also in the column direction, is a serial data input line 120, which is connected by a contact pin 121 to the ASIC 103. A serial data output line 122, which is connected by a contact pin 123 to the ASIC 103, runs adjacent to the serial data input line 120. A +5V-supply line 124, which is connected by a contact pin 125 to the ASIC 103, also runs in the column direction adjacent to the two data lines 120, 122. A supply of ASIC 103 can alternatively also take place with 3.3V.

Figure 28:
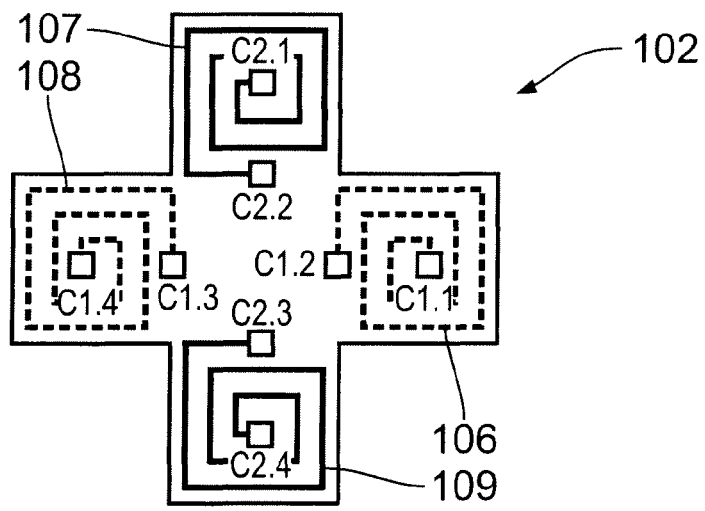
FIGS. 28 and 29 schematically show two configurations of coil plates, in plan view, in each case.
Figure 29:
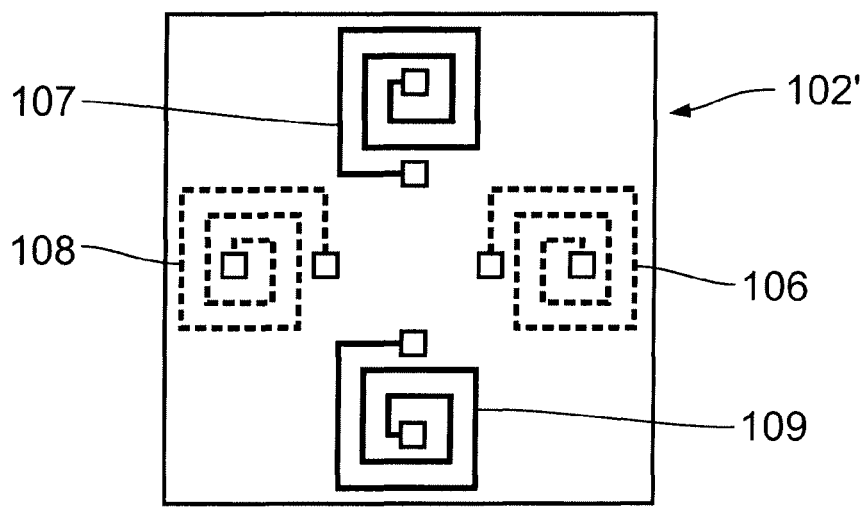

FIGS. 28 and 29, in a view similar to FIG. 26, show two configurations of one of the coil plates 102, 102'.

The coil plate 102 according to FIG. 28 corresponds to that of FIG. 26, the individual coils 106 to 109 in the coil plate 102 according to FIG. 28 being shown with a small number of windings.

Figure 30:
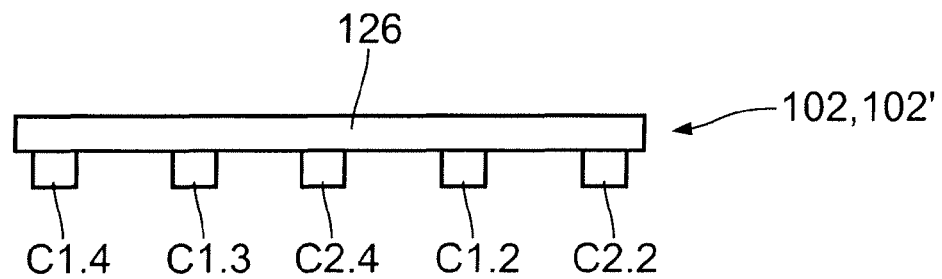
FIG. 30 shows a side view of the coil plates according to FIG. 28 or 29.

In contrast to the coil plate 102 according to FIG. 28, the coil plate 102' according to FIG. 29 is not cruciform in plan view, but square in plan view. The structure and the interconnection of the coil plate 102' according to FIG. 29 corresponds to that of the coil plate 102 according to FIG. 28. FIG. 30 shows a side view of the coil plates 102 or 102'. The individual coils 106 to 109 are printed on a ceramic carrier 126 of the coil plate 102, 102'. The contact pins CX.Y are formed on a lower side of the plate-like ceramic carrier 126, the contact pins C1.4, C1.3, C2.4, C1.2 and C2.2 being visible from the left to the right in the view of FIG. 30.

Figure 31:
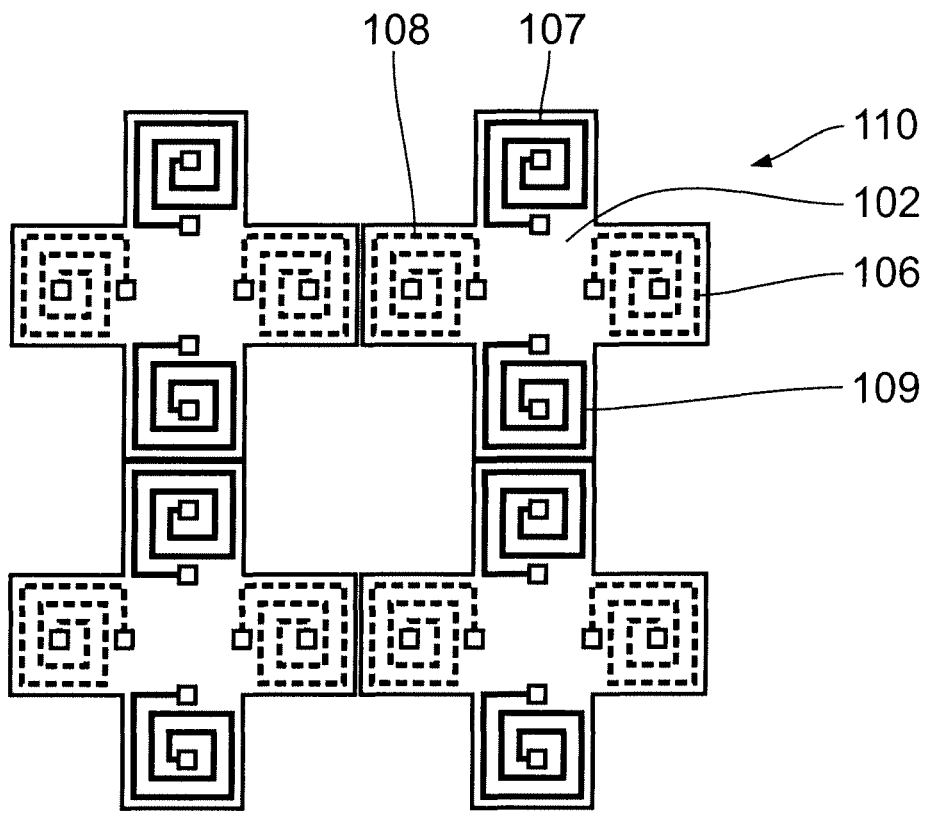
FIG. 31 shows an arrangement of four coil plates according to FIG. 28, which are associated with one of the integrated electronic displacement circuits (ASIC), in a plan view.

FIG. 31 illustrates the arrangement of the coil plate 102 according to FIG. 28 in the coil plate group 110. In an arrangement of this type, an interconnection with the ASIC 103 arranged in the central installation space (cf. also FIG. 34) is possible, as described above in connection with FIG. 27.

Figure 32:
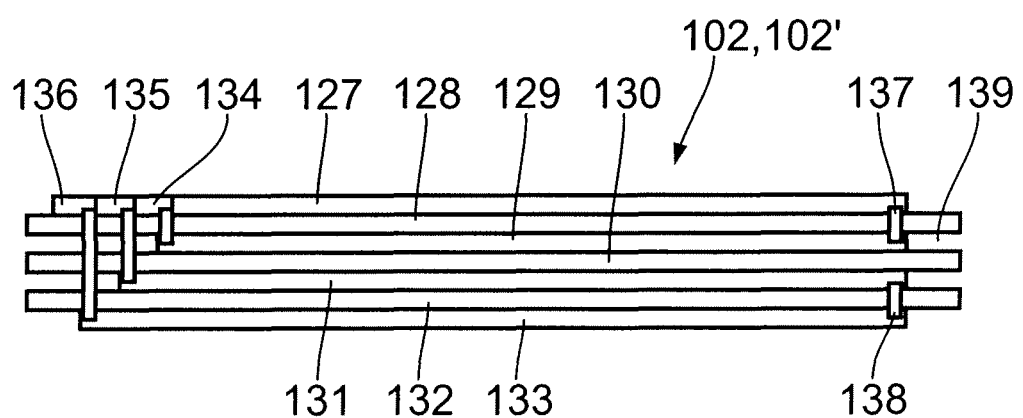
FIG. 32 shows a section through one of the coil plates perpendicular to the plate plane, a configuration of the coil plate with a stacked structure being shown.

FIG. 32 shows a variant of a stack structure for the coil plate 102 or 102' in a cross section perpendicular to the plate plane. The uppermost coil layer 127 in FIG. 32 forms the individual coil 107 according to FIG. 31. An insulating substrate carrier layer 128 is arranged below the coil layer 127. A further coil layer 129, which forms the individual coil 109 according to FIG. 31, is arranged below the substrate carrier layer 128. A further coil layer 131, which forms the individual coil 106 according to FIG. 31 is in turn separated by a further substrate carrier layer 130 from the further coil layer 129. A further coil layer 133, which forms the individual coil 108 according to FIG. 31, is separated from this further coil layer 131 by a further substrate carrier layer 132.

Arranged adjacent to the uppermost coil layer 127 in FIG. 32, in the plane thereof, are contact portions 134, 135, 136, which are in each case electrically conductively connected by a connection material (via material) to the coil layers 129, 131 and 133. All the coil layers 127, 129, 131, 133 are thus accessible in FIG. 32 from above to an electrical contacting to activate the individual coils 106 to 109. The contact portions 134 to 136 are electrically insulated from one another and with respect to the coil layer 127. The coil layers 127, 129 are electrically connected to one another by a contact passage 137, which bridges the substrate carrier layer 128. The two coil layers 131 and 133 are electrically conductively connected to one another by a contact passage 138, which bridges the substrate carrier layer 132. The two contact passages 137, 138 are in turn manufactured from via material. At their edges, the coil layers 127, 129, 131, 133 or the contact portions 134 to 136, in their respective planes, are surrounded by a filling material 139.

Figure 33:
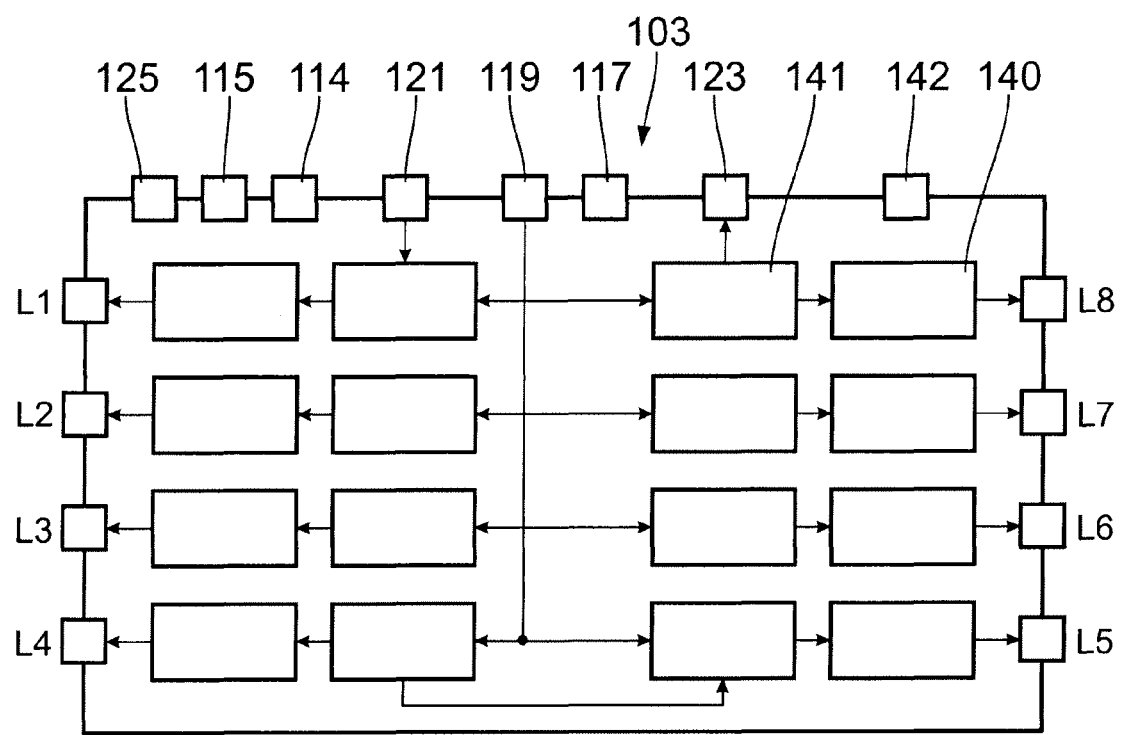
FIG. 33 shows a functional circuit diagram of the integrated electronic displacement circuit (ASIC)

FIG. 33 is a functional circuit diagram of the ASIC 103.

The contact pins L1 to L8 are connected to respective associated driver units 140. The ASIC 103 therefore has a total of eight driver units 140 which can be activated independently of one another. Each of the driver units 140 is connected to a data interface 141. In total, eight data interfaces 141 of this type are present in the ASIC 103. The eight data interfaces 141 of the ASIC 103 in each case have a bandwidth of 12 bits, a serial input and a parallel output for connection to the driver units 140. The eight data interfaces 141 are connected in series on the input side and, on the one hand, have a signal connection via the contact pin 121 with the serial data input line 120 and, on the other hand, via the contact pin 123 with the serial data output line 122. The data interfaces 141 have a signal connection via the contact pin 119 with the serial clock generator line 118.

The ASIC 103 also has an earth contact pin 142 for earthing the ASIC 103. The ASIC 103 is connected to the earth line 115a via the earth contact pin 142 (cf. FIG. 27).

FIG. 34 schematically shows the mechanical arrangement of the components of the activation circuit board 100 respectively associated with one group 110 of coil plates 102. The ASIC 103 is arranged in the installation space in the centre of the group 110.

Arranged around the group 110 are a total of eight cooling/assembly bores 143 in the form of an equidistant grid. A heat sink finger 144, which provides connection with good heat conduction between the lower sides of the coil plates 102 and the ASICs 103 on the one hand, and the ceramic substrate 101, on the other hand, may be arranged in the bores 103. The cooling/assembly bores 144 may alternatively also be used as a passage for the fixing pins 98 or 104 (cf. FIG. 24).

Figure 36:
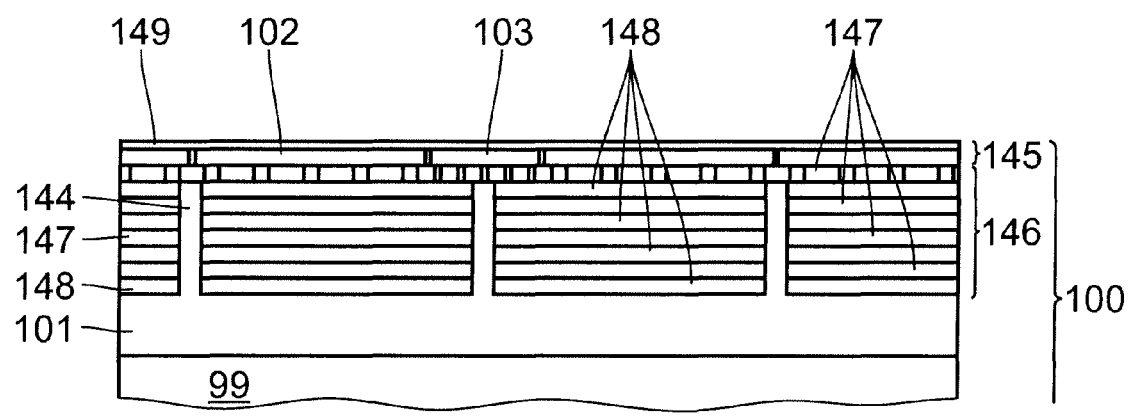
FIG. 36 shows, enlarged and not true to scale, a section along the line XXXVI-XXXVI in FIG. 35.

FIG. 36 also shows, between a component plane 145 of the activation circuit board 100, in which the coil plates 102 of the ASICs 103 are arranged and the ceramic substrate 101, a multi-layer structure 146 with alternating insulator layers 147 and conductive layers 148. The conductive layers 148 are in each case connected to the various control, data and supply lines, which were explained about in connection with FIG. 27. The conductive layers 148 may be applied with the aid of a CPC (Copper Plated Ceramic) method or with the aid of a screen printing method. A description of the CPC method is to be found under http://www.keramik-substrat.de/seite1.htm.

Toward the mirror plate 97, the component plane 145 is covered by a protective cover layer 149. The cover layer 149 is realised by sputtered-on silicon oxide.

A layer construction according to FIG. 32 or 36 can be achieved with the aid of an LTCC (Low Temperature Co-fired Ceramics) technique. Details with regard to the applications of the LTCC method are to be found in the conference transcript of the microelectronics conference ME08, ISBN 978-3-85133-049-6.

Figure 35:
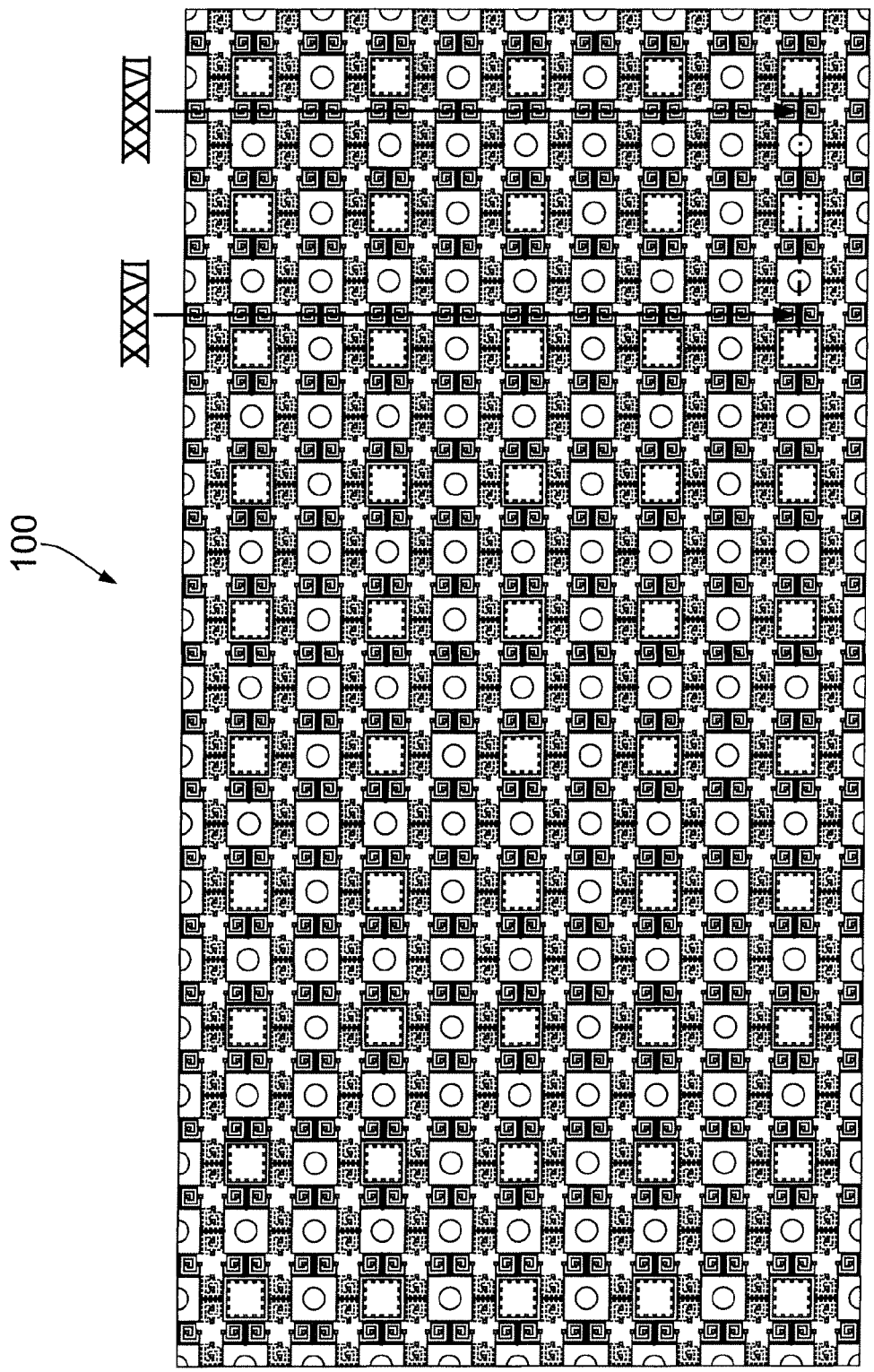
FIG. 35 shows a plan view of the activation circuit board for a part individual mirror array of the optical module with a dense packing of coil plate groups with associated integrated electronic displacement circuits (ASIC)
Figure 37:
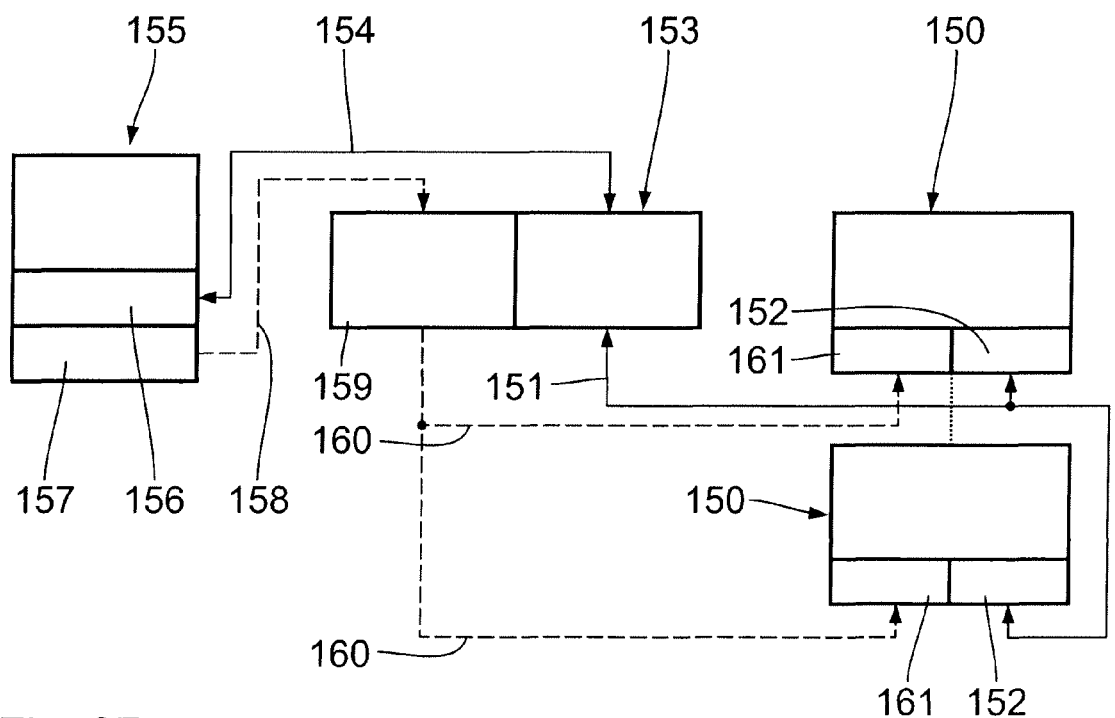
FIG. 37 schematically shows an activation plan for a plurality of part individual mirror arrays of the optical module.

FIG. 37 shows an activation plan for an optical module in the manner of the facet mirror 13, for example, which is divided into a plurality of part individual mirror assays of, in each case, individual mirrors 27 arranged line-wise and column-wise. A plan view of the activation circuit board 100 for a part individual mirror array 150 of this type is shown overall in FIG. 35. The part individual mirror array, the component of which is the activation circuit board 100 according to FIG. 35, has ten mirror columns each with five mirrors, in other words includes an individual mirror array of five lines each with ten individual mirrors 27.

In the activation plan according to FIG. 37, the main control lines 111, 112, the data lines 120, 122, the reset line 116 and the serial clock generator line 118 are combined to form a serial data bus 151. Using bus interfaces 152, the part individual mirror arrays 150 have a signal connection via the data bus 151 with a central control device 153. The central control device 153 may be a microcontroller or a programmable integrated circuit, (Field Programmable Gate Array) or a special programmable logistics module (Programmable Logic Device, PLD). The central control device 153 has a signal connection to a target application interface 155 via a bidirection signal line 154. The projection exposure system 1 is controlled thereby and the respective illumination settings can be predetermined thereby. The target application interface 155 has a signal module 156 and a supply module 157. The signal module 156 is connected to the signal line 154. The supply module 157 of the target application interface 155 is connected by a supply line 158 to a central supply device 159, which is integrated in the central control device 153. The central supply device 159 is connected by supply lines 160 to supply interfaces 161 of the part individual mirror arrays 150. The supply interfaces 161 are connected on the array side to the supply lines 124 of the individual array columns (cf. FIG. 27).

Figure 38:
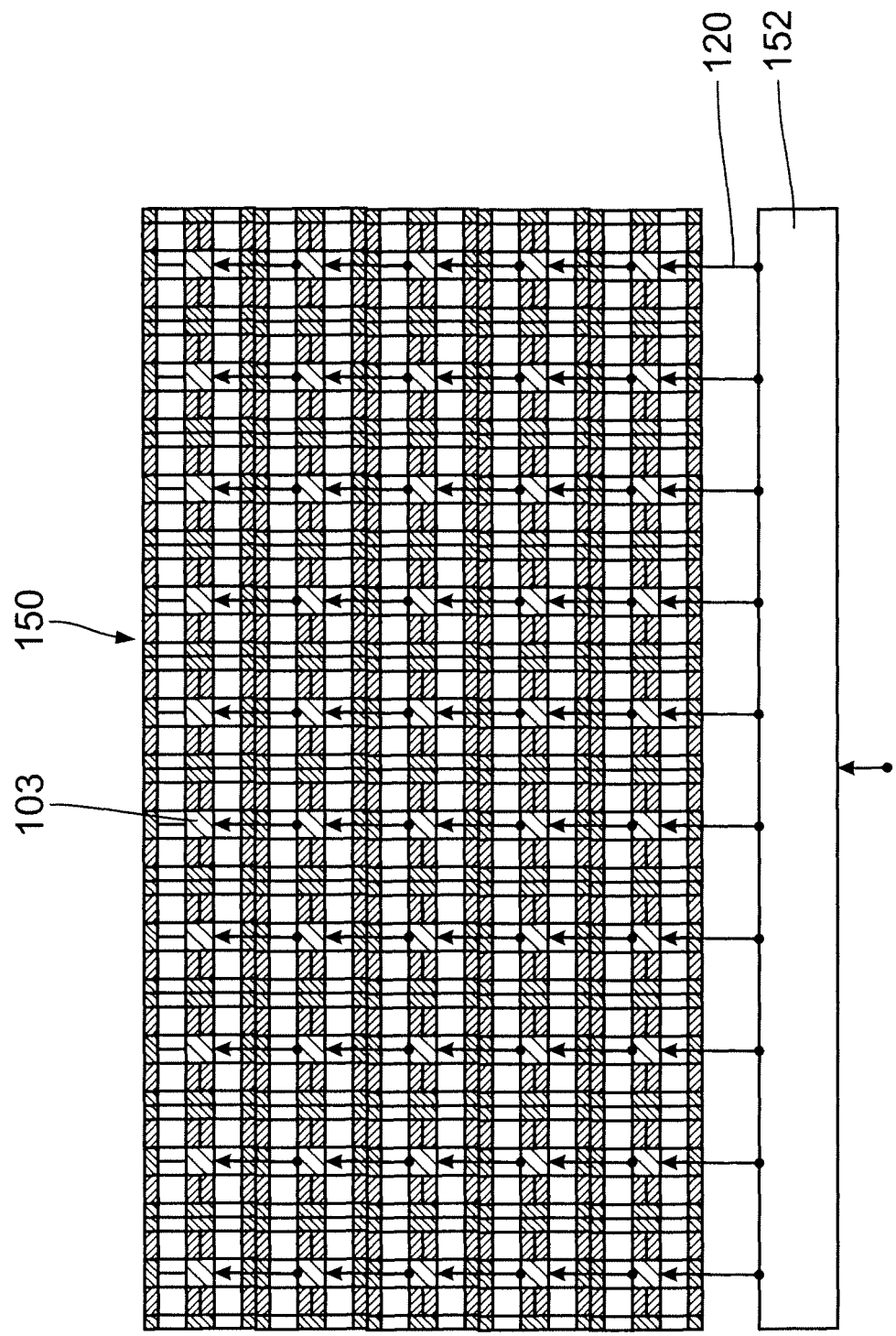
FIG. 38 schematically shows a data flow through the activation circuit board according to FIG. 35.

FIG. 38 illustrates the activation of the individual ASICs 103 within a part individual mirror array 150. The bus interface 152 is connected, in particular, to the serial data input lines 120. The ASICs 103 of one respective column are cascadable, so ASICs 103 of one respective column of the part individual mirror array 150 can be serially addressed.

The activation of the optical module will be explained below by specifying individual positions of the individual mirrors 27 of the optical module with the aid of the activation of one of the part individual mirror arrays 150:

An illumination setting, for example a dipole illumination, is firstly predetermined by the target application interface 155. A defined position of each of the individual mirrors 27 within the part individual mirror array 150 is associated with this dipole illumination. The central control device 153 relays the position information to the associated part individual mirror array 150 via the bus interface 152. A control word, which is transmitted on the data bus 151, contains the address of the part individual mirror array 150 to be addressed, the column address of the column to be addressed within this part individual mirror array 150, the complete control data for the coil plates 102 which can be activated by each ASIC 103 within the addressing column and a test number. The ASICs 103 of the addressed ASIC column read in the control data via their serial data input lines 120. Each ASIC 103 processes the control data intended for it and passes corresponding control values to the control contact pins L1 to L8, so the individual coil pairs 106, 108 and/or 107, 109 of the coil plate 102 are provided with current in the predetermined manner to produce a deflection magnetic field (cf. magnetic field lines 45 in FIG. 11). In accordance with this provision of current to the individual coils 106 to 109 of the coil plate 102, a deflection of the permanent magnet 44 takes place and therefore a tilting of the associated mirror body 35 of the individual mirror 27. Using the check value transferred with the control word, each ASIC can check whether it has correctly read in the control word allocated to it. A read-in process recognised to be faulty is reported back via the data output line 122 and the data bus 151 to the central control device 153, so a corresponding fault check can take place.

The adjacent arrangement of the main control lines 111, 112 running along the columns and of the adjacent portions of the earth line 115a avoids undesired magnetic fields being produced because of a current flow through the control lines 111, 112.

A fine specification of the respective coil flow can be achieved with a high resolution depth via the data interfaces 141 and the driver unit 140 of the ASICs 103, which contain a self-regulating linear high current-capable controller in a bridge circuit configuration. The linearity of the controller can be produced on the basis of a pulse width modulation.

What is claimed is:

1. An optical module, comprising:
a chamber capable of being evacuated; and
a mirror in the chamber, the mirror comprising a plurality of individual mirrors, each individual mirror comprising:
  a mirror body including a reflection face;
  a support structure; and
  a thermally conductive portion that mechanically connects the support structure to the mirror body,
wherein:
  for at least one individual mirror, the thermally conductive portion comprises a plurality of thermally conductive strips arranged radially, adjacent thermally conductive strips being separated from each other, and each of the plurality of thermally conductive strips connecting the mirror body to the support structure;
  for at least one individual mirror, an actuator is associated with the mirror body, the actuator being configured to displace the mirror body relative to the support structure in at least one degree of freedom;
  for at least some of the thermally conductive portions, the thermally conductive portion includes an inner connection portion and an outer connection portion, the inner connection portion including a connection transition with the support body or the mirror body, and the outer connection portion including a connection transition with the support body or the mirror body;
  the thermally conductive strips are arranged so that a plurality of the thermally conductive strips follow each other on a radius between the inner connection portion and the outer connection portion;
  the reflection faces complement each other to provide an overall mirror reflection face; and
  the optical module is configured to guide a radiation beam.

2. The optical module of claim 1, wherein the thermally conductive strips have a spiral configuration.

3. The optical module of claim 1, further comprising a central electrode pin and a counter-electrode, wherein:
  the central electrode pin extends perpendicular to a mirror plane of the at least one individual mirror;
  the electrode pin is connected to the mirror body of the at least one individual mirror;
  the electrode pin is configured to actuate the at least one individual mirror;
  the electrode pin cooperates with the counter-electrode; and
  the counter-electrode is connected to the support body.

4. The optical module of claim 3, comprising a plurality of counter-electrodes surrounding the electrode pin in a peripheral direction, wherein the counter-electrodes are electrically insulated from each another.

5. The optical module of claim 1, further comprising:
an integrated electronic displacement circuit associated the at least one individual mirror having the actuator associated therewith; and
a central control device configured in signal connection with the integrated electronic displacement circuit.

6. The optical module of claim 1, wherein:
the at least one individual mirror having an actuator associated therewith comprises a plurality of individual mirrors, each of which has a respective actuator associated therewith;
the optical module further comprises:
  a plurality of integrated electronic displacement circuits, each integrated electronic displacement circuit being associated with a corresponding one of the plurality of individual mirrors having an actuator associated therewith; and
  a central control device configured in signal connection with the integrated electronic displacement circuit.

7. The optical module of claim 6, wherein the integrated electronic displacement circuits are arranged in a cascaded fashion.

8. The optical module of claim 6, further comprising a displacement activation board arranged on a side of the individual mirrors opposite to the reflection faces, wherein the integrated electronic displacement circuits are in the displacement activation circuit board.

9. The optical module of claim 8, wherein the displacement activation circuit board comprises a multi-layer construction which comprises conductive layers and insulating layers, wherein conductive layers are separated from each other by at least one insulating layer.

10. The optical module of claim 8, wherein the displacement activation board comprises a substrate layer which comprises at least one material selected from the group consisting of a ceramic material and a silicon material.

11. The optical module of claim 8, wherein the displacement activation board comprises a heat sink on the side of the displacement activation circuit board opposite to the individual mirrors.

12. The optical module of claim 8, further comprising a plurality of heat sink fingers leading from a heat sink through the displacement activation circuit board and into a region of the integrated electronic displacement circuits or the individual coils.

13. The optical module of claim 6, wherein:
the actuators are Lorentz actuators;
the integrated electronic displacement circuits are activated via a protective extra-low voltage;
a plurality of individual coils is arranged adjacent to each of the integrated electronic supply circuits;
the coils are part of a Lorentz actuator; and
the integrated electronic displacement circuit being in signal connection with the individual coils.

14. The optical module of claim 13, wherein the integrated electronic displacement circuit of the Lorentz actuator is configured to be activated by a voltage of +/−1 V.

15. The optical module of claim 13, wherein the Lorentz actuators comprise a permanent magnet.

16. The optical module of claim 6, wherein:
control lines configured to activate the integrated electronic displacement circuits are guided parallel to earth lines;
one of the respective control lines is directly adjacent to an earth line;

adjacent to each of the integrated electronic supply circuits is a plurality of individual coils which are part of a Lorentz actuator; and the integrated electronic displacement circuit are in signal connection with the individual coils.

17. The optical module of claim 6, wherein each integrated electronic displacement circuit is associated with a group of individual mirrors.

18. The optical module of claim 1, wherein the optical module is divided into a plurality of part individual arrays, each part individual array comprising individual mirrors arranged line-wise and column-wise in each case.

19. The optical module of claim 1, wherein the thermally conductive portions are configured to dissipate a thermal power density of at least 1 $kW/m^2$ absorbed by the mirror bodies to the support structure.

20. The optical module of claim 1, wherein the at least one individual mirror having an actuator associated therewith comprises a plurality of individual mirrors, each of which has a respective actuator associated therewith.

21. The optical module of claim 20, wherein actuators comprise electromagnetically operating actuators.

22. The optical module of claim 21, wherein the actuators comprise Lorentz actuators.

23. The optical module of claim 22, wherein a current-carrying actuator component of the Lorentz actuator is configured as conductor paths printed on a base body.

24. The optical module of claim 23, wherein a plurality of layers lying one above the other of printed-on conductor paths are arranged on the base body.

25. The optical module of claim 20, wherein the actuators comprise reluctance actuators.

26. The optical module of claim 20, wherein the actuators comprise piezo actuators.

27. The optical module of claim 1, wherein each thermally conductive portion comprises a plurality of thermally conductive strips, adjacent thermally conductive strips are separated from each other, and each thermally conductive strip connects the mirror body to the support structure.

28. The optical module of claim 1, wherein the support structured are configured to be actively cooled during use of the optical module.

29. The optical module of claim 1, wherein a sum of the reflection faces of the mirror bodies is more than half an overall area occupied by the overall reflection face of the mirror.

30. The optical module of claim 1, wherein the mirror bodies are arranged in a matrix-like manner.

31. The optical module of claim 1, wherein the mirror is a facet mirror comprising a plurality of facets, and the mirror bodies are facets of the facet mirror.

32. The optical module of claim 1, wherein the mirror is a facet mirror comprising a plurality of facets, and a single facet of the facet mirror is defined by a plurality of individual mirror bodies.

33. A method of controlling an optical module which comprises a plurality of individual mirrors arranged line-wise and column-wise and which are displaceable in a controlled manner with respective associated integrated electronic displacement circuits, the method comprising:
    specifying an individual mirror column to be activated; and
    transferring control values to the electronic displacement circuits associated with the individual mirror column,
    wherein the optical module is an optical module according to claim 1.

34. The method of claim 33, wherein:
    the optical module is divided into a plurality of part individual arrays;
    each part individual array comprising individual mirrors arranged line-wise and column-wise; and
    the method comprises selecting a part individual mirror array to be activated before the specifying the individual mirrors to be activated.

35. The method of claim 33, further comprising, after transferring the control values, checking the transferred control values.

36. An illumination optical system, comprising:
    an optical module according to claim 1,
    wherein the illumination optical system is a microlithography illumination optical system configured to illuminate an object field with light.

37. An illumination system, comprising:
    an EUV radiation source configured to produce EUV radiation; and
    an illumination optical system comprising an optical module according to claim 1,
    wherein the illumination optical system is a microlithography illumination optical system configured to illuminate an object field with the EUV radiation.

38. A projection exposure system, comprising:
    an EUV radiation source configured to produce EUV radiation; and
    an illumination optical system comprising an optical module according to claim 1, the illumination optical system being configured to illuminate an object field with the EUV radiation; and
    a projection optical system configured to image an object in the object field into an image field,
    wherein the projection system is a microlithography projection exposure system.

39. A method using a microlithography projection exposure system which comprises an illumination optical system and a projection optical system, the method comprising:
    using the illumination system to illuminate an object in in object field; and
    using the projection optical system to project at least a portion of the object into an image field,
    wherein the illumination system comprises an optical module according to claim 1.

40. A mirror, comprising:
    a plurality of individual mirrors, each individual mirror comprising:
        a mirror body including a reflection face;
        a support structure; and
        a thermally conductive portion that mechanically connects the support structure to the mirror body,
    wherein:
        for at least one individual mirror, the thermally conductive portion comprises a plurality of thermally conductive strips arranged radially, adjacent thermally conductive strips being separated from each other, and each of the plurality of thermally conductive strips connecting the mirror body to the support structure;
        for at least one individual mirror, an actuator is associated with the mirror body, the actuator being configured to displace the mirror body relative to the support structure in at least one degree of freedom;
        for at least some of the thermally conductive portions, the thermally conductive portion includes an inner connection portion and an outer connection portion, the inner connection portion including a connection transition with the support body or the mirror body, and the outer connection portion including a connection transition with the support body or the mirror body;

the thermally conductive strips are arranged so that a plurality of the thermally conductive strips follow each other on a radius between the inner connection portion and the outer connection portion; and the reflection faces complement each other to provide an overall mirror reflection face.

* * * * *